United States Patent
Leong et al.

(10) Patent No.: US 10,958,268 B1
(45) Date of Patent: Mar. 23, 2021

(54) TRANSFORMER-BASED DRIVER FOR POWER SWITCHES

(71) Applicant: Infineon Technologies Austria AG, Villach (AT)

(72) Inventors: Kennith Kin Leong, Villach (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/560,145

(22) Filed: Sep. 4, 2019

(51) Int. Cl.
| | |
|---|---|
| *H03B 1/00* | (2006.01) |
| *H03K 3/00* | (2006.01) |
| *H03K 17/687* | (2006.01) |
| *H01L 23/495* | (2006.01) |
| *H01L 23/00* | (2006.01) |
| *H02M 7/06* | (2006.01) |

(52) U.S. Cl.
CPC ..... *H03K 17/687* (2013.01); *H01L 23/49575* (2013.01); *H01L 24/08* (2013.01); *H01L 24/48* (2013.01); *H01L 2224/08054* (2013.01); *H01L 2224/48137* (2013.01); *H01L 2924/12* (2013.01); *H01L 2924/13064* (2013.01); *H01L 2924/1425* (2013.01); *H02M 7/06* (2013.01)

(58) Field of Classification Search
CPC ............... H03K 17/687; H01L 24/08; H01L 23/49575; H01L 24/48; H01L 2224/48137; H01L 2224/08054; H01L 2924/13064; H01L 2924/1425; H01L 2924/12; H02M 7/06
USPC ..................................... 327/109
See application file for complete search history.

(56) References Cited

U.S. PATENT DOCUMENTS

| | | | |
|---|---|---|---|
| 4,801,822 A | 1/1989 | Idaka et al. | |
| 5,514,996 A | 5/1996 | Aizawa | |
| 6,316,956 B1 | 11/2001 | Oglesbee | |
| 7,952,418 B2 | 5/2011 | McDonald et al. | |
| 8,760,219 B2 | 6/2014 | Chao | |
| 9,209,787 B2 | 12/2015 | Shelton et al. | |
| 9,305,917 B1 * | 4/2016 | Curatola | H01L 29/66462 |
| 9,595,950 B1 | 3/2017 | Seok | |

(Continued)

OTHER PUBLICATIONS

Coccia, A., et al., "Wide input Voltage range Compensation in DC/DC Resonant Architectures for On-Board Traction Power Supplies", IEEE 2007 European Conference on Power Electronics and Applications, Sep. 2-5, 2007, 1-10.

(Continued)

*Primary Examiner* — Metasebia T Retebo
(74) *Attorney, Agent, or Firm* — Murphy, Bilak & Homiller, PLLC

(57) ABSTRACT

Transformer-driven power switch devices are provided for switching high currents. These devices include power switches, such as Gallium Nitride (GaN) transistors. Transformers are used to transfer both control timing and power for controlling the power switches. These transformers may be careless, such that they may be integrated within a silicon die. Rectifiers, pulldown control circuitry, and related are preferably integrated in the same die as a power switch, e.g., in a GaN die, such that a transformer-driven switch device is entirely comprised on a silicon die and a GaN die, and does not necessarily require a (large) cored transformer, auxiliary power supplies, or level shifting circuitry.

20 Claims, 31 Drawing Sheets

(56) References Cited

U.S. PATENT DOCUMENTS

| | | |
|---|---|---|
| 9,853,637 B1 | 12/2017 | Meiser et al. |
| 9,865,729 B1 | 1/2018 | Pendharkar et al. |
| 10,483,352 B1 | 11/2019 | Mokhti et al. |
| 10,720,913 B1 | 7/2020 | Leong et al. |
| 2006/0238927 A1* | 10/2006 | Morbe .................... H01L 25/16 361/18 |
| 2007/0081280 A1* | 4/2007 | Strzalkowski .......... H02M 1/08 361/18 |
| 2009/0072269 A1 | 3/2009 | Suh et al. |
| 2010/0060326 A1 | 3/2010 | Palmer et al. |
| 2010/0118458 A1 | 5/2010 | Coffey |
| 2010/0205614 A1 | 8/2010 | Harrington |
| 2011/0273258 A1* | 11/2011 | Duplessis ............ B23K 1/0016 336/200 |
| 2012/0158188 A1 | 6/2012 | Madala |
| 2014/0049297 A1 | 2/2014 | Nagai et al. |
| 2014/0091311 A1 | 4/2014 | Jeon et al. |
| 2014/0167724 A1 | 6/2014 | Deng et al. |
| 2015/0171852 A1* | 6/2015 | Pang ....................... H01L 29/78 327/109 |
| 2015/0228353 A1 | 8/2015 | Qing et al. |
| 2015/0255547 A1 | 9/2015 | Yuan et al. |
| 2015/0295574 A1 | 10/2015 | Nagai |
| 2015/0318851 A1 | 11/2015 | Roberts et al. |
| 2015/0344335 A1 | 12/2015 | Hughes et al. |
| 2015/0381148 A1 | 12/2015 | Zeng |
| 2016/0072376 A1* | 3/2016 | Ahlers ................ H01L 27/0733 310/68 D |
| 2016/0087622 A1 | 3/2016 | Kaeriyama |
| 2016/0142048 A1 | 5/2016 | Zoels et al. |
| 2017/0040312 A1* | 2/2017 | Curatola ................ H01L 29/417 |
| 2017/0271497 A1 | 9/2017 | Fayed et al. |
| 2017/0331471 A1* | 11/2017 | Yuzurihara ............. H02M 1/08 |
| 2019/0123215 A1* | 4/2019 | Stark ......................... G01J 1/44 |
| 2019/0372567 A1 | 12/2019 | Yoshida et al. |
| 2020/0007091 A1 | 1/2020 | Li et al. |
| 2020/0007119 A1 | 1/2020 | Li et al. |
| 2020/0020779 A1 | 1/2020 | Trang et al. |
| 2020/0343352 A1 | 10/2020 | Trang et al. |

OTHER PUBLICATIONS

Leong, Kennith Kin, et al., "Integrated Failsafe Pulldown Circuit for GaN Switch", U.S. Appl. No. 16/423,314, filed May 28, 2019.

\* cited by examiner

1362a
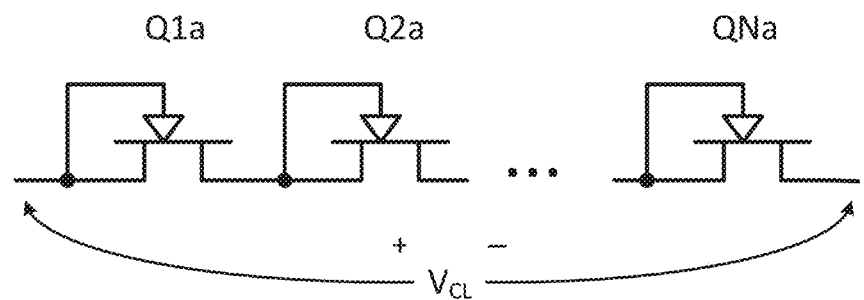
1362b
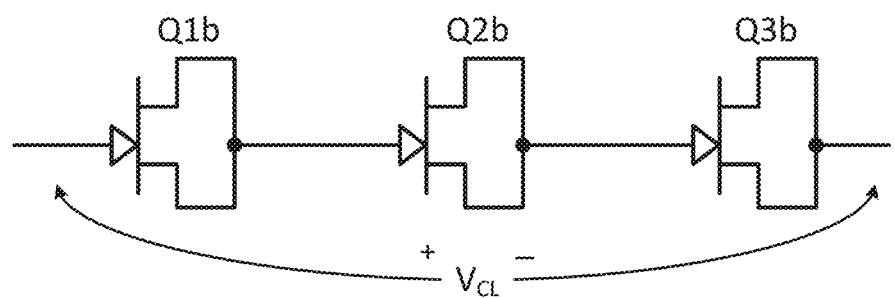
1362c
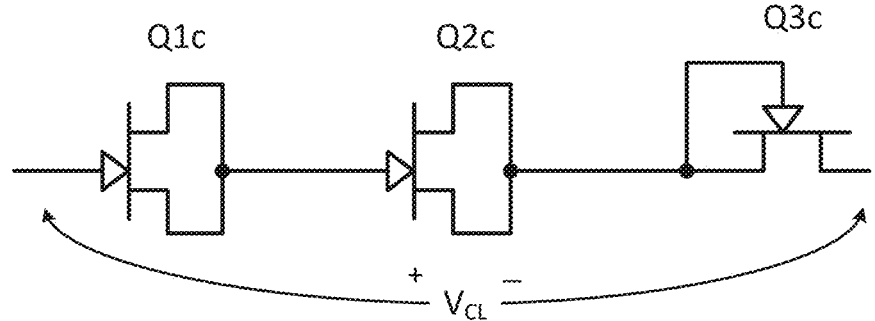
Figure 13B

TRANSFORMER-BASED DRIVER FOR POWER SWITCHES

TECHNICAL FIELD

The present application relates to circuit topologies and related devices for driving power switches, wherein a transformer and rectifier provide both the control timing and the power for driving a control terminal of a power switch.

BACKGROUND

Many modern electronic circuits, such as switching voltage converters and motor drivers, make use of power switches to control the flow of high current levels. A power switch typically requires a driver circuit for sourcing current to and sinking current from a control terminal (e.g., a gate) of the power switch. The driver for a power switch that has a load terminal (e.g., a source) coupled directly to ground may be relatively straightforward, as the circuitry for such a driver may be ground-referenced. However, power switches are often not coupled directly to ground. For example, a half bridge configuration may include a low-side power switch that is coupled between ground and a switching node, and a high-side power switch that is coupled between a positive-voltage power rail and the switching node. In other examples, a switched-capacitor converter or a multi-level class-D amplifier may include a series of cascaded power switches between a ground and a positive voltage rail, wherein the voltages at load terminals (e.g., sources) of the intermediate power switches typically fall between ground and the positive voltage.

Power switches that are not coupled to ground, e.g., high-side or other floating power switches, present unique challenges for driving. Consider, e.g., an n-channel metal-oxide semiconductor field-effect transistor (MOSFET) power switch having a source, a drain, and a gate (control terminal). The turn-on voltage driven onto the MOSFET gate is referenced to the source voltage, which may be floating. The driver typically has a reference terminal for coupling to the MOSFET source, and must be provided with a supply providing power at a positive voltage, e.g., 5V, above the reference (source) voltage. Hence, a floating power supply, referenced to the MOSFET source voltage, is needed. Furthermore, the driver input, which is typically a digital signal alternating, e.g., between ground and 3V, usually requires that its voltage be level shifted in accordance with the MOSFET source voltage.

A typical technique for powering a high-side MOSFET driver uses a bootstrap power supply, which comprises a diode and a relatively large capacitor. The capacitor is charged, via the diode, from a low-voltage (ground-referenced) power source when the high-side MOSFET is turned off and its source is grounded, e.g., during an interval in which a low-side MOSFET is turned on. Once the high-side MOSFET source is disconnected from ground, e.g., when the low-side MOSFET is turned off, the capacitor supplies power to the high-side MOSFET driver as needed for turning the high-side MOSFET on. Another technique uses a transformer, in which a magnetic core is used to transfer power from a ground-referenced primary to a secondary side that is referenced to the source voltage of a high-side MOSFET, so as to power the MOSFET driver. In addition to a floating power supply, such as the bootstrap or transformer-based supplies described above, level-shifting circuitry is typically needed to translate the control signal input to the MOSFET driver to a requisite, e.g., source-referenced, voltage range and, in some cases, to provide isolation. Such level shifting is typically accomplished using capacitive coupling or level-shifting transformers.

The floating power supply and level shifting for a power switch driver may require somewhat complex and physically large circuitry, which is not easily integrated in semiconductor dies. Simplified circuit topologies for driving power switches are desired, wherein most or all of the circuitry may be integrated in semiconductor dies.

SUMMARY

Circuit topologies and related techniques for driving power switches are provided. These topologies use techniques in which power and the switch control signal are transferred using the same transformer. Such circuits are amenable to integration within semiconductor dies and, in many cases, large capacitors and magnetic devices (e.g., transformer cores) may be avoided. The resultant power switch drivers are often smaller, simpler, and less expensive that existing drivers, and much of the driver circuitry may be integrated in the same semiconductor die as the power switch.

According to an embodiment of a transformer-based switch device, the switch device comprises a power transistor, a transformer, and a rectifier. The power transistor has first and second load terminals, and a control terminal that controls conductivity between the first and second load terminals. The transformer has a primary and a secondary winding. The rectifier is coupled between the secondary winding and the control terminal. The secondary winding and the rectifier are configured to transfer requisite energy and control timing for driving the control terminal, so as to control conductivity between the first and second load terminals, based upon an input waveform coupled to the primary winding. During a turn-on interval of the power transistor, the input waveform has a plurality of high-frequency pulses that the transformer and the rectifier convert to a turn-on control pulse that is provided to the control terminal for turning on the power transistor. During a turn-off interval of the power transistor, the input waveform has a direct-current (DC) level.

According to an embodiment of a transformer-driven power switch system, the system comprises a power transistor, a transformer, a rectifier, and a control logic circuit. The power transistor has first and second load terminals, and a control terminal that controls conductivity between the first and second load terminals. The transformer has a primary winding and a secondary winding. The rectifier couples the secondary winding of the transformer to the control terminal. The control logic circuit comprises a control input and a frequency generator. The frequency generator is configured to provide a turn-on high-frequency signal to the primary winding responsive to the control input receiving a turn-on level, and to provide a direct-current (DC) signal to the primary winding responsive to the control input receiving a turn-off level.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

FIG. 2A illustrates a schematic diagram of a circuit topology for a transformer-driven power switch device that uses a normally-off pulldown switch and a pulldown resistor, whereas

FIG. 13A illustrates a schematic diagram of a circuit topology for a transformer-driven power switch device that uses a normally-on pulldown switch and a voltage clamp, whereas FIG. 13B illustrates examples for voltage clamps that are based upon GaN switches.

DETAILED DESCRIPTION

The embodiments described herein provide circuits and techniques for a transformer-driven power switch device and associated systems. These embodiments are described primarily in contexts in which the power switch within a transformer-driven power switch device is a Gallium Nitride (GaN) based Gate Injection Transistor (GIT). The circuit topologies described herein provide particular advantages when GaN transistors are used for the power switches. Many of these advantages are related to the fact that GaN transistors require relatively low energy (charge) transfer to/from their gates (control terminals) when transitioning between on and off states, at least as compared with conventional metal-oxide semiconductor field-effect transistors (MOSFETs) or similar. This relatively low charge requirement makes it feasible for a coreless transformer to provide the energy (charge) for turning the power switch on and/or off, while avoiding the size and cost of bulky magnetics as used by cored transformers that are typically required by other switch types, e.g., MOSFETs. Coreless transformers may be integrated within a semiconductor die, within a printed circuit board (PCB), etc., to achieve small size and cost.

Besides the above-described transformer, which transfers alternating current (AC) energy from a primary side to a secondary side, the transformer-driven switch device also includes a rectifier to convert the secondary-side AC energy into direct current (DC) energy appropriate for applying to the gate of the power switch. When the power switch is a GaN-based transistor, e.g., a GIT, the GaN die may also be advantageously used to provide other circuit elements. Diodes, resistors, and even capacitors that are part of the rectifier or other driver circuitry may be integrated in the same GaN die as the power switch, thereby providing a high level of integration and associated low size and cost.

While GaN-based GITs, which are a type of enhancement-mode (normally-off) High Electron Mobility Transistor (HEMT), are used in many of the examples herein, other HEMTs, including depletion-mode (normally-on) HEMTs and HEMTs based on other group III/V materials, provide advantages similar to those described above and further detailed below. However, it should be understood that the circuit topologies and techniques described herein are not limited to use with GaN-based or other HEMT power switches, and that other advantages may be realized when these topologies and techniques are used with other power switch types including, e.g., silicon and silicon-carbide based power switches.

Figure 1:
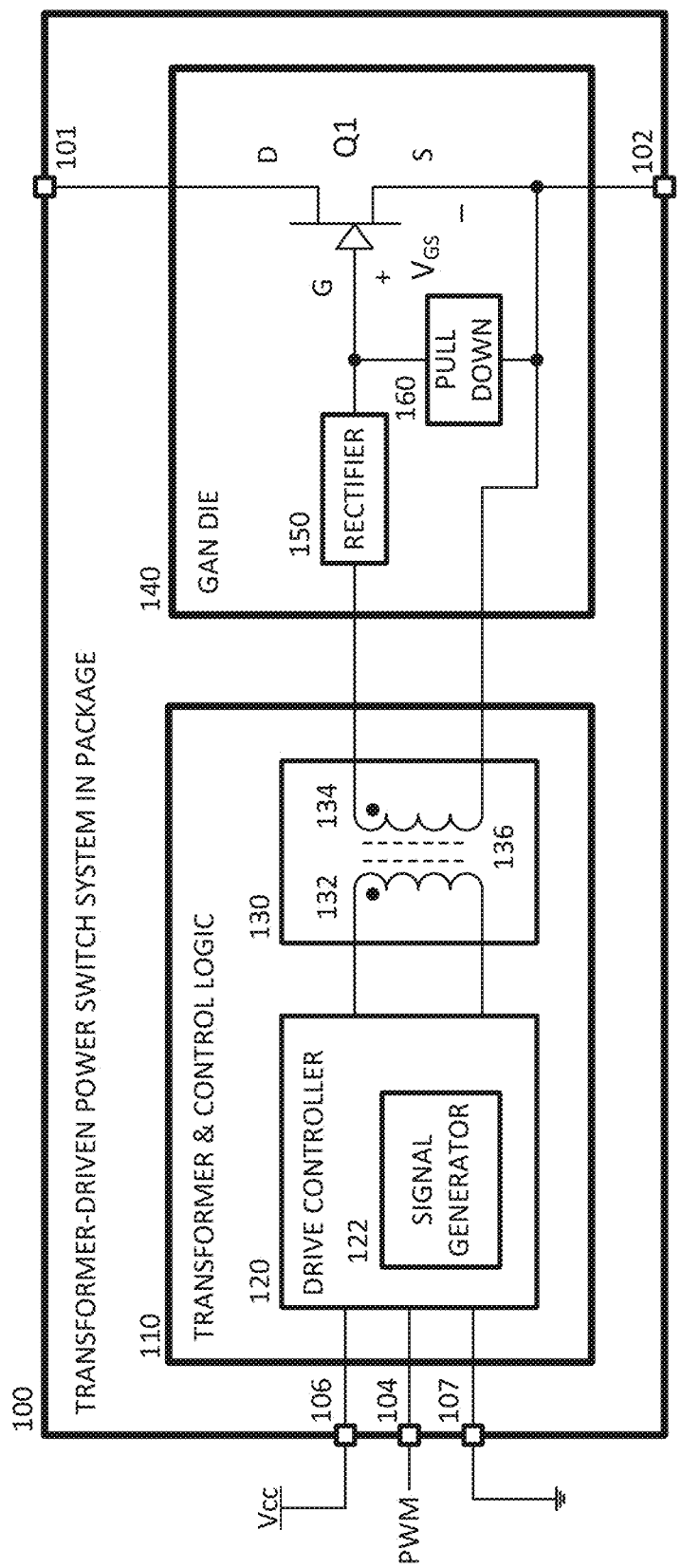
FIG. 1 illustrates a high-level schematic diagram of a transformer-driven power switch system.

The invention is described below using several exemplary circuits, which should not be considered limiting. FIG. 1 illustrates a block diagram for a system in package (SiP) based upon an enhancement-mode GaN transistor (GIT). This is followed by descriptions of several detailed circuits in which a rectifier and other driver circuitry are integrated in a GaN die with a GIT. These circuits vary primarily based upon how the GIT's gate is pulled down to turn the GIT off. For clarity of organization, these circuits are classified into circuits using a normally-off pulldown driver switch, a normally-on pulldown driver switch, and no active pulldown driver switch. Subsequent to these circuit descriptions, example circuits are shown for driving a bidirectional GaN power switch comprised of GITs, a normally-on GaN power switch, and a bidirectional switch comprised of normally-on GaN power switches. Next, an example of a transformer-based switch device making use of a power MOSFET, rather than a GaN-based power switch, is described.

FIG. 1 illustrates a system in package (SIP) 100 for a transformer-driven power switch device. The system 100 includes a GaN power switch Q1 and circuitry for driving the GaN power switch Q1. The system 100 has load terminals 101, 102 corresponding to the drain (D) and source (S) of the power switch Q1, and an input terminal 104 for receiving a control signal from an external controller (not shown for ease of illustration). As illustrated, the control signal is a pulse-width-modulated (PWM) waveform wherein, e.g., a duty cycle or frequency of the PWM waveform controls when the power switch conducts. For example, the power switch Q1 may conduct during intervals when the PWM waveform is high, whereas the power switch Q1 may be turned off during intervals when the PWM waveform is low. For the illustrated embodiment, the PWM waveform is a ground-referenced digital signal that alternates between 0V and a CMOS/TTL voltage level. The system 100 also has terminals 106, 107 for connection to a power supply providing the voltage rail Vcc and to ground.

The system 100 includes a transformer and control logic 110, and a GaN die 140. The transformer and control logic 110 includes a drive controller 120 and a transformer 130. The drive controller 120 includes control logic that is ground referenced. A signal generator 122 within the driver controller 120 provides a high-frequency signal to the transformer 130. The provided signal has a frequency that is significantly higher than that of the PWM waveform input to the system 100. For example, the PWM signal may switch the power switch at 150 KHz, whereas the signal generator 122 provides a square wave having a frequency greater than 100 MHz, e.g., a 200 MHz square wave. In an exemplary embodiment, which is described in further detail below, the high-frequency signal from the signal generator 122 is coupled to the transformer 130 when the PWM input is high, whereas no energy is provided to the transformer 130 when the PWM input is low. The interval during which no energy is provided to the transformer 130 may be provided by coupling 0V or some other direct-current (DC) level to the transformer when the PWM input is low, or by disconnecting the transformer 130 such that its inputs are floating. In further embodiments, examples of which are described below, additional transformer windings (not shown in FIG. 1) may be used to actively turn off the power switch Q1.

The signal generator 122 may be implemented using a half-bridge circuit that is switched at the high frequency so as to provide a high-frequency waveform, alternating between the voltage rail $V_{CC}$ and ground, to the transformer 130. In other embodiments, the signal generator 122 includes a full-bridge circuit, so as to provide a signal alternating between +Vcc and −Vcc, as in several of the following examples. Other signal generation techniques may also be used. Because signal generators are well-known in the art, further detail is not provided.

The transformer 130 comprises a primary winding 132 and a secondary winding 134. Some embodiments additionally include a magnetic core 136, which is illustrated using dotted lines to indicate that the magnetic core 136 is optional. In preferred embodiments, including typical circuits wherein the power switch Q1 is a GaN-based transistor, the transformer 130 is coreless, i.e., there is no magnetic core 136. (As used herein, the term "coreless transformer" describes a transformer in which the windings are not coupled by a magnetic core. Such coreless transformers may include air cores or similar.) For embodiments with such coreless transformers, the drive controller 120 and transformer 130 may be integrated within a same semiconductor die, e.g., a silicon die. In other embodiments, a cored transformer 130 may be needed and the transformer and control logic 110 may or may not be implemented within a single semiconductor die. For example, a conventional MOSFET power switch may require more gate charge than can be feasibly provided by a coreless transformer within a certain time period and, thus, may require a cored transformer instead. For such a case, the transformer and control logic 110 may not be implementable within a single semiconductor die.

The GaN die 140 includes the GIT power switch Q1, a rectifier 150, and a pulldown circuit 160. The rectifier 150 converts the AC energy provided by the secondary winding 134 into a DC voltage appropriate for turning on the gate (G) of the power switch Q1. For example, the rectifier 150 may convert AC energy from the transformer 130 into a DC gate-to-source voltage $V_{GS}$ greater than a threshold voltage, e.g., 3.3V, of the power switch Q1, so as to turn on the power switch Q1. The pulldown circuit 160 serves to discharge the gate voltage $V_{GS}$, so as to turn off the power switch Q1 when no AC energy is provided by the transformer and control logic 110. Such discharging may be accomplished using pulldown switches or other active components, or may be accomplished using passive components.

While the system 100 includes one primary winding, one secondary winding, and one rectifier, several of the circuit topologies described below include additional windings and additional rectifiers. Variations of a transformer-driven power switch device are provided below, wherein the described circuits vary primarily in the number of transformer windings, the rectifier circuitry, and the pulldown circuit.

Transformer-Based Switch Devices Based on a Normally-Off Rundown Switch

Figure 2A:
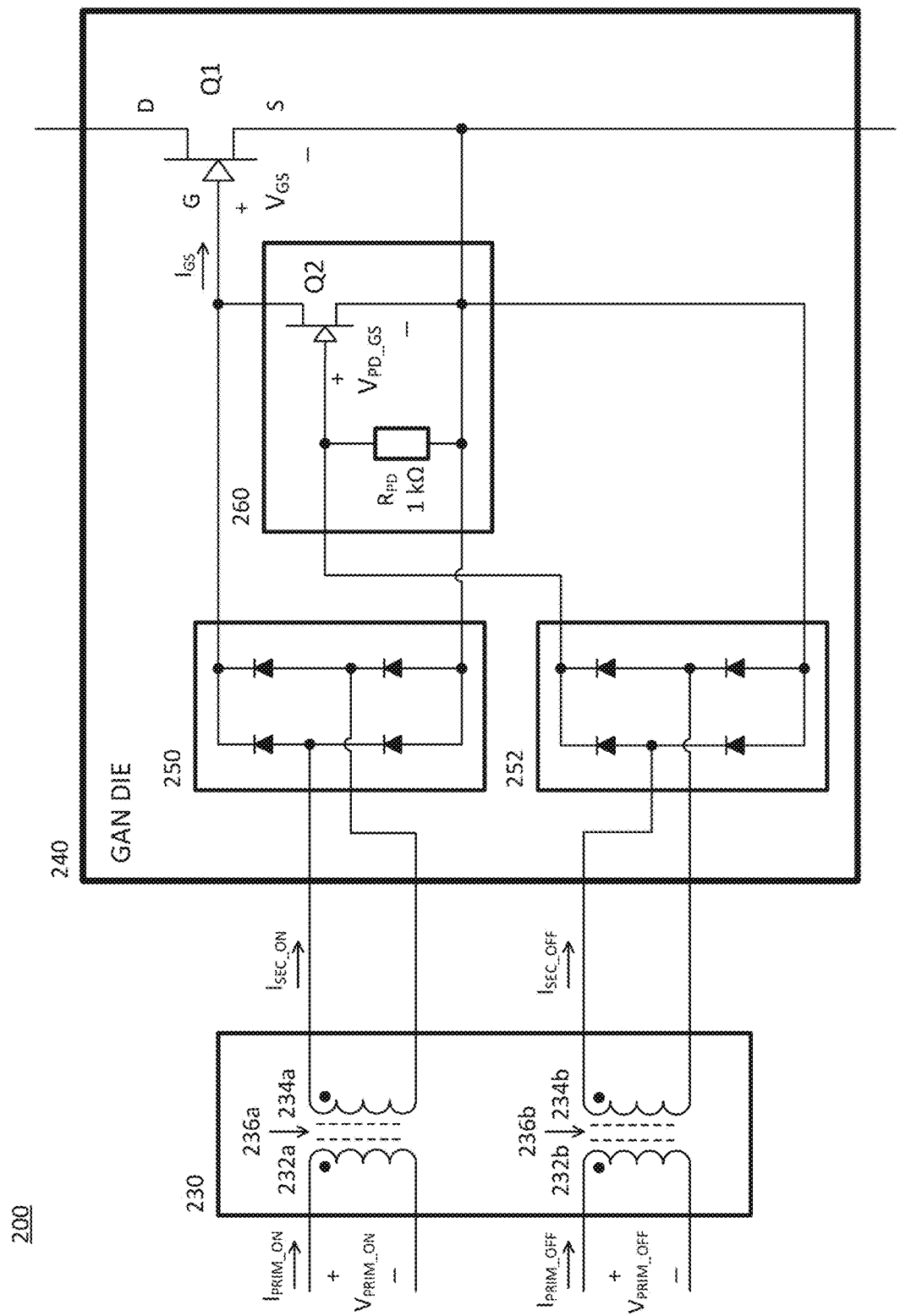

FIG. 2A illustrates circuitry for a transformer-driven switch device 200 that includes one set of transformer windings and a first rectifier for turning on the power switch Q1. Another set of transformer windings, a second rectifier, and a normally-off pulldown switch are included for turning off the power switch Q1. As illustrated, the transformer-driven switch device is partitioned into a transformer 230 and a GaN die 240. As described above in relation to FIG. 1, the transformer 230 may be part of silicon die that also includes a drive controller.

The transformer 230 includes a first primary winding 232a, a first secondary winding 234a, and (optionally) a first core 236a, for supplying a secondary-side AC current $I_{SEC\_ON}$. The transformer 230 further includes a second primary winding 232b, a second secondary winding 234b, and (optionally) a second core 236b, for supplying a secondary-side AC current $I_{SEC\_OFF}$. A signal generator, such as the signal generator 122 of FIG. 1, generates primary-side voltages $V_{PRIM\_ON}$ and $V_{PRIM\_OFF}$ that are coupled to the primary windings 232a, 232b. For example, a signal generator may provide a substantially continuous AC waveform, wherein the AC waveform is coupled to the first primary winding 232a for turn-on intervals of the power switch Q1 and is instead coupled to the second primary winding 232b for turn-off intervals of the power switch Q1. In another example, separate signal generators may be used for driving the primary windings 232a, 232b, wherein each is activated/deactivated as needed.

In addition to the power switch Q1, the GaN die 240 includes a turn-on rectifier (diode bridge) 250, a turn-off rectifier 252, and a pulldown circuit 260. The turn-on rectifier 250 rectifies the secondary-side current $I_{SEC\_ON}$ so as to provide a positive DC current $I_{GS}$ to the power switch gate (G). The turn-on rectifier 250 maintains a positive voltage $V_{GS}$ at the gate (G) during turn-on intervals, and prevents the gate voltage from discharging back into the transformer 230. A capacitor may be included to smooth the gate voltage $V_{GS}$, but, as illustrated, the gate capacitance of the power switch Q1 provides the filtering.

The pulldown circuit 260 and turn-off rectifier 252 serve to turn off the power switch Q1 when a turn-off signal $V_{PRIM\_OFF}$ is applied to the second primary winding 232b. A resultant secondary-side current $I_{SEC\_OFF}$ is rectified by the turn-off rectifier 252, thereby providing a charging current to the gate of the pulldown driver switch Q2, which turns on the pulldown driver switch Q2. With the switch Q2 turned on, the gate of the power switch Q1 is discharged and its gate-to-source voltage $V_{GS}$ is driven to zero, so as to turn off the power switch Q1.

It is important to ensure that the normally-off pulldown driver switch Q2 remains fully off throughout the on state of the power switch Q1. A pulldown resistor $R_{PD}$, which is illustrated as a 1 kΩ resistor, maintains the off state of the pulldown driver switch Q2 when energy is not being supplied by the second secondary winding 234b, e.g., when the power switch Q1 is turned on.

As suggested previously, the pulldown driver switch Q2, the resistor $R_{PD}$ and the rectifiers 250, 252 are preferably implemented within the same GaN die as the power switch Q1. The normally-off pulldown driver switch Q2 is constructed in much the same way as the power switch Q1, but may be smaller as it does not need to support the high current levels required by the power switch Q1. For example, the pulldown driver switch Q2 may include significantly fewer GaN channels (fingers) than the power switch Q1, may have a smaller channel width as compared with the power switch Q1, and/or may omit or have a shorter drift (voltage blocking) region than the power switch Q1. The pulldown resistor $R_{PD}$ may be implemented within the GaN die 240 using one or more two-dimensional electron gas (2DEG) regions of the GaN semiconductor die, each of which is substantially a GaN HEMT without a gate.

Figure 2B:
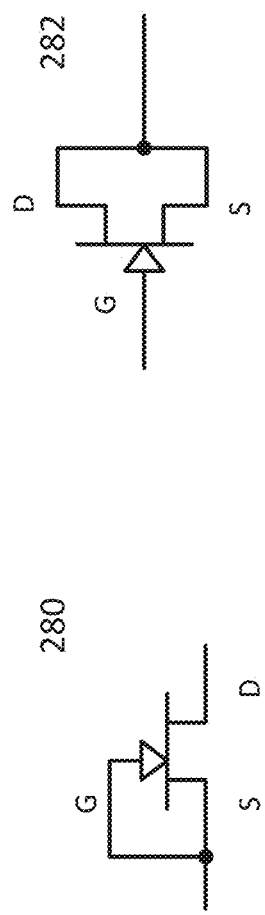
FIG. 2B illustrates circuits for providing diodes based upon GaN switches.

Diodes within the rectifiers 250, 252 may be implemented within the GaN die using GaN transistors that are configured as gated diodes or PN diodes. While not shown in FIG. 2A, these diodes may, in some embodiments, be GaN Schottky diodes. As illustrated in FIG. 2B, a gated diode 280 may be constructed by coupling the gate to the source of a normally-on GaN-based switch (GIT), thereby converting the switch into a two-terminal device (diode) in which the gate/source serves as the anode and the drain serves as the cathode. Such a gated diode typically has a threshold (knee) voltage of 0.9V to 1.5V. Alternatively, a PN diode 282 may be constructed by coupling the drain and source of a GIT together, thereby converting the switch into a two-terminal device (diode) in which the gate is the anode and the drain/source is the cathode. Such a PN diode has a relatively stable threshold (knee) voltage of about 3.3V. Unless stated otherwise, the GaN-based diodes within the examples herein, including the rectifiers 250, 252 of FIG. 1, are gated diodes having threshold voltages of 1.2V.

As illustrated in FIG. 2A, each set of windings within the transformer 230 has a turns ratio of 1:2, but other ratios may be used. For a primary-side power supply Vcc having a voltage of 3V, wherein the primary-side AC voltages $V_{PRIM\_ON}$, $V_{PRIM\_OFF}$ each alternate between +3V and −3V, the 1:2 turns ratio ensures adequate turn-on voltages, e.g., greater than 3.3V, are provided at the respective gates of the power switch Q1 and the pulldown driver switch Q2. The 3V primary-side voltage is doubled by the transformer 230, and reduced by the diode voltage drops (e.g., 2*1.2V 2.4V) within the rectifiers 250, 252. Also, the primary and secondary-side voltages are reduced slightly by resistive losses of the transformer 230.

Figure 3:
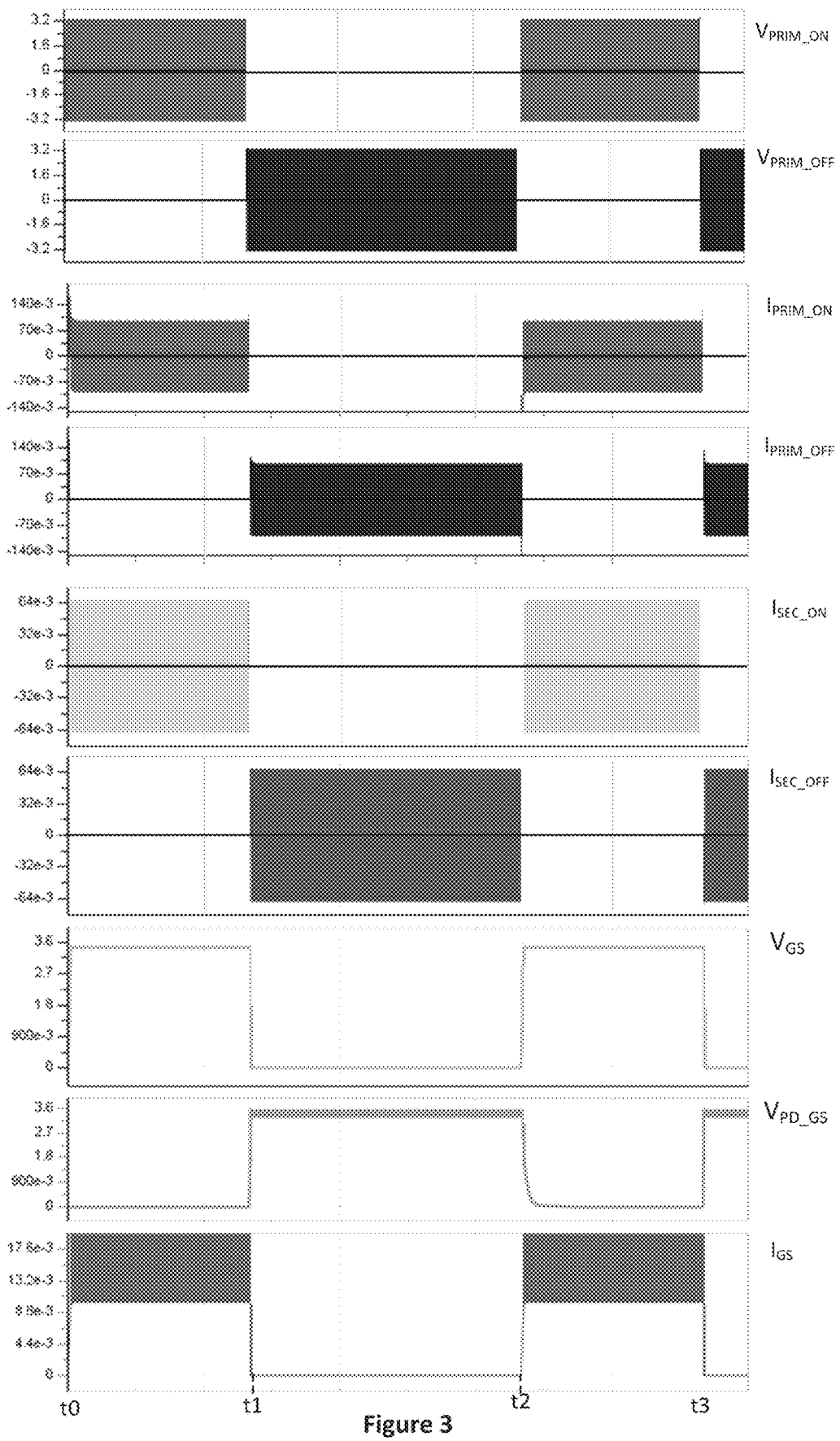
FIG. 3 illustrates voltage and current waveforms corresponding to the circuit of FIG. 2A.

FIG. 3 illustrates voltage and current waveforms corresponding to the transformer-driven power switch device of FIG. 2A. The primary-side AC voltages $V_{PRIM\_ON}$, $V_{PRIM\_OFF}$ are driven with a frequency of 200 MHz, and the power switch Q1 is switched at a frequency of 150 KHz. As shown in FIG. 3, the turn-on voltage $V_{PRIM\_ON}$ is actively driven with a 200 MHz+/−3V signal between times t0 and t1, and a corresponding AC turn-on current $I_{PRIM\_ON}$ is provided to the first primary winding 232a. A resultant secondary-side AC current $I_{SEC\_ON}$ is output from the secondary winding 234a and rectified by the diode bridge 250. The diode bridge 250 outputs a rectified current $I_{GS}$, having an average of about 16 mA RMS, which charges the gate (G) of the power switch Q1 during the turn-on interval. The resultant gate-to-source voltage $V_{GS}$ of nearly 3.6V exceeds the turn-on threshold (e.g., 3.3V) of the power switch Q1, such that the power switch Q1 is turned on during these intervals. (The transformer 230 steps the 3V input up to about 6V, which is then reduced by 2.4V due to the voltage drops across two of the gated diodes within the rectifier 250.)

During the interval from time t1 to t2, the turn-on voltage $V_{PRIM\_ON}$ is inactive, e.g., is floating or held at 0V, such that no primary or secondary-side currents $I_{PRIM\_ON}$, $I_{PRIM\_OFF}$ flow. The turn-off voltage $V_{PRIM\_OFF}$ is actively driven with a 200 MHz signal alternating between +3V and −3V during this interval, and a corresponding turn-off current $I_{PRIM\_OFF}$ is provided to the second primary winding 232b. A resultant secondary-side AC current $I_{SEC\_OFF}$ is output from the secondary winding 234b and rectified by the diode bridge 252, such that the gate of the pulldown switch Q2 is driven to nearly 3.6V, as shown in the waveform for $V_{PD\_GS}$, which is above the turn-on threshold for the pulldown switch Q2. With the pulldown driver switch Q2 conducting, the gate and source of the power switch Q1 are shorted together, so that the power switch Q1 turns off.

At time t2, the turn-on voltage $V_{PRIM\_ON}$ is again actively driven, so as to turn the power switch Q1 on again. The pulldown resistor $R_{PD}$ serves to passively pull the gate of the pulldown driver switch Q2 down to the source voltage, so as to force the switch Q2 off. This can be seen in the decay of the voltage $V_{PD\_GS}$ starting at time t2.

Figure 4:
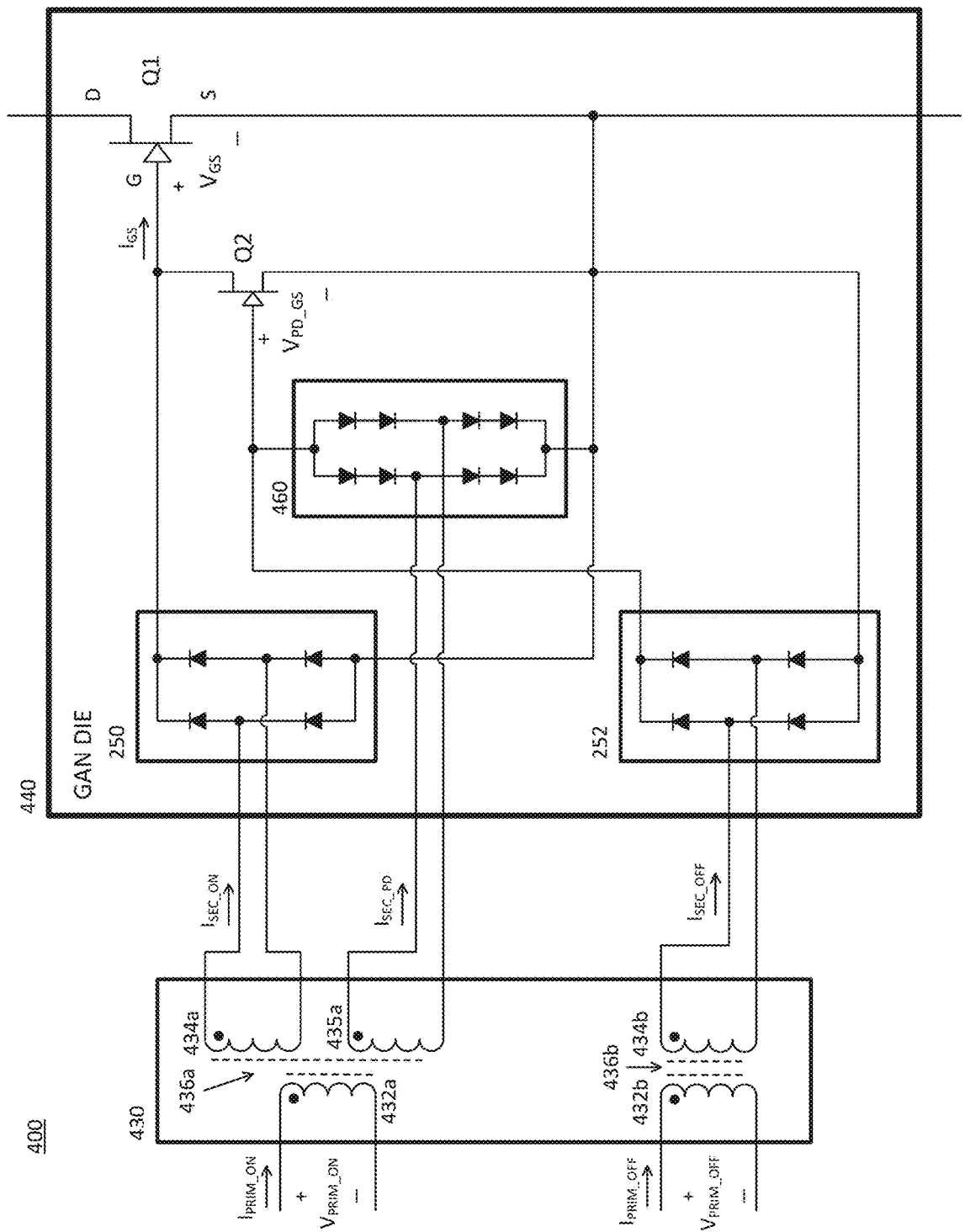
FIG. 4 illustrates a schematic diagram of another circuit topology for a transformer-driven power switch device that uses a normally-off pulldown switch, in which the pulldown resistor of FIG. 2A is replaced with a diode bridge.

FIG. 4 illustrates a variation 400 of the transformer-driven switch device of FIG. 2A, in which the passive pulldown resistor $R_{PD}$ is replaced with a stacked diode bridge 460 that serves to actively drive the pulldown driver switch Q2 off when the power switch Q1 is driven on. The diode bridge 460 is driven from another secondary winding 435a, which is also coupled to (driven by) the first primary-side winding 432a. This diode bridge 460 is stacked in a reverse direction to the rectifier 252 and with twice the diodes in each leg, so as to drive a negative voltage onto the gate of the pulldown driver switch Q2 when the power switch Q1 is turned on. Since the two secondary windings 434a, 435a are both coupled to the same (turn-on) primary winding 432a, energy is transferred simultaneously ensuring that the pulldown driver switch Q2 is driven off when the power switch Q1 is turned on. The stacked diode bridge configuration serves to discharge the gate of the pulldown driver switch Q2 and drive the gate voltage $V_{PD\_GS}$ not only below the threshold voltage of the switch Q2, but also can be driven to a negative voltage. Driving a negative voltage onto the gate of the switch Q2 may speed up the turn off of the switch Q2 which, in turn, speeds up the turn on transition of the power switch Q1.

As in the switch device of FIG. 2A, a pulldown diode bridge (rectifier) 252 is used to drive a positive voltage onto the pulldown gate, so as to turn on the pulldown switch Q2 when the power switch Q1 is turned off. The activation voltage for diode bridge 252 must be lower than the activation voltage for the diode bridge 460. The transformer 430 of FIG. 4 differs from that of FIG. 2A in that the turns ratio of the first primary winding 432a to the secondary windings 434a, 435a is 1:1.2:1:2, and the turns ratio of the second primary winding 432b to its secondary winding 434b is 1:1. Such a configuration ensures that the voltage driven onto the diode bridge 460 is sufficient to activate the diodes therein when the power switch Q1 is driven on.

Figure 5:
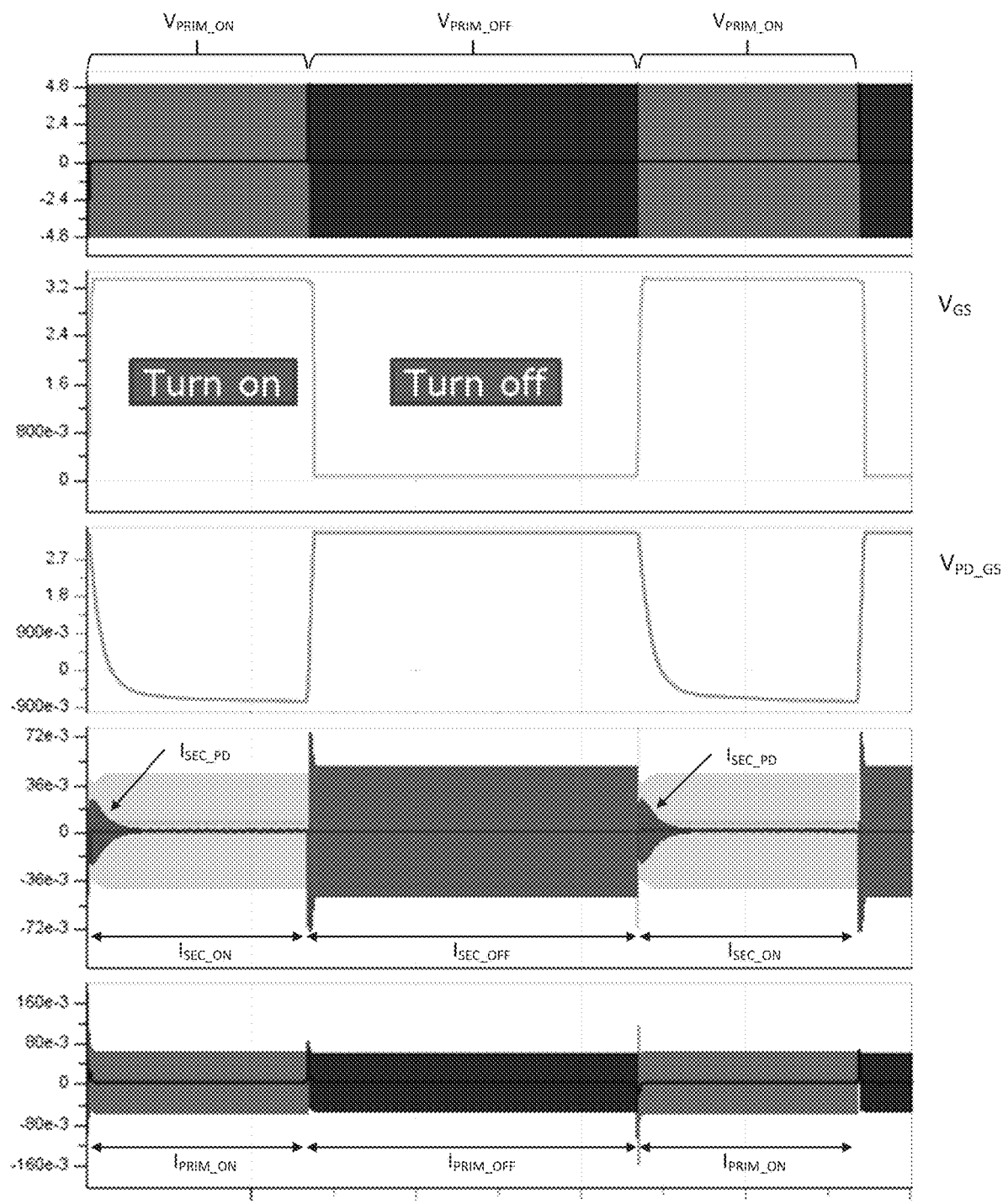
FIG. 5 illustrates voltage and current waveforms corresponding to the circuit of FIG. 4.

FIG. 5 illustrates voltage and current waveforms corresponding to the transformer-driven power switch device of FIG. 4. As in FIG. 3, the primary-side AC voltages $V_{PRIM\_ON}$, $V_{PRIM\_OFF}$ are driven with a frequency of 200 MHz, and the power switch Q1 is switched at a frequency of 150 KHz. The primary-side turn-on and turn-off voltages alternate between +5V and −5V, which differs from the levels of FIG. 3. Other than their levels, the primary and secondary side currents $I_{PRIM\_ON}$, $I_{PRIM\_OFF}$, $I_{SEC\_ON}$, $I_{SEC\_OFF}$ are similar to those of FIG. 3. Unlike FIG. 3, FIG. 5 shows a waveform corresponding to a pulldown current $I_{SEC\_PD}$, which is the current output from the secondary winding 435a of FIG. 4. This current rises just after the turn-on voltage $V_{PRIM\_ON}$ becomes active, so as to discharge the gate of the pulldown switch Q2. The pulldown current $I_{SEC\_PD}$ decays towards zero as this gate charge dissipates. Also, FIG. 5 shows that the pulldown gate voltage $V_{PD\_GS}$ can drop to a negative value when the power switch Q1 is turned on.

While the switch device of FIG. 4 may provide some performance advantages, e.g., faster turn-on speed, relative to the switch device of FIG. 2A, the switch device of FIG. 4 is more complex in that it requires another secondary winding and another stacked diode bridge. The switch device of FIG. 6 provides similar advantages, but with a less complex circuit.

Figure 6:
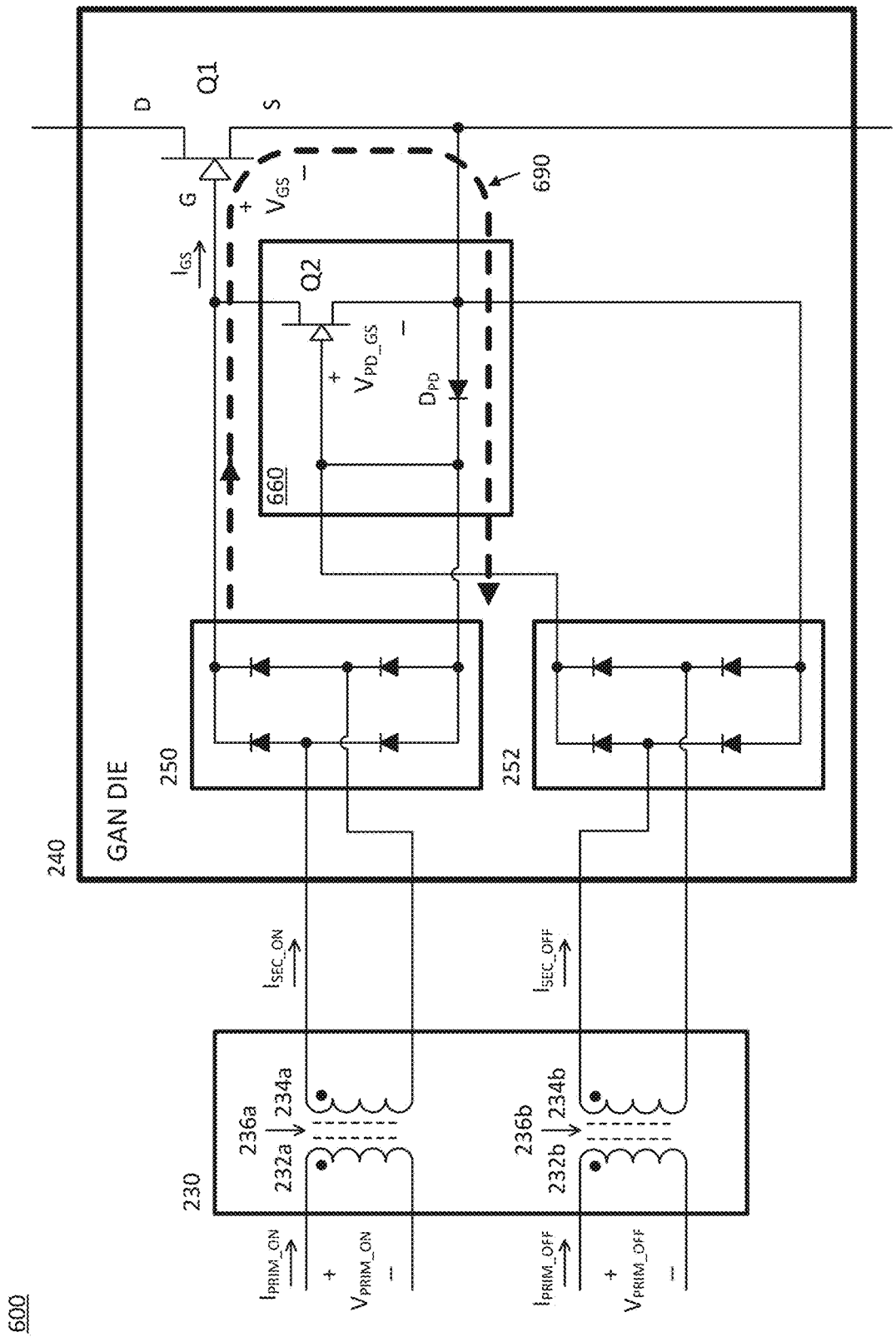
FIG. 6 illustrates a schematic diagram of another circuit topology for a transformer-driven power switch device that uses a normally-off pulldown switch.

FIG. 6 illustrates another version 600 of a transformer-driven switch device. This version 600 is similar to that of FIG. 2A, except that a pulldown circuit 660 includes a pulldown diode $D_{PD}$ that is used to drive the pulldown switch Q2 to its off state, rather than the pulldown resistor $R_{PD}$ of the pulldown circuit 260 of FIG. 2A. This topology provides an advantage that the pulldown switch Q2 is driven off using the same current loop 690 that turns on the power switch Q1. By connecting the pulldown diode $D_{PD}$ between the source and gate of the pulldown switch Q2, the threshold voltage of this diode $D_{PD}$ will provide a negative voltage at the gate of the pulldown switch Q2 when current flows in the current loop 690, therefore ensuring the pulldown switch Q2 is driven to its off state whenever the main switch is driven on.

Figure 7:
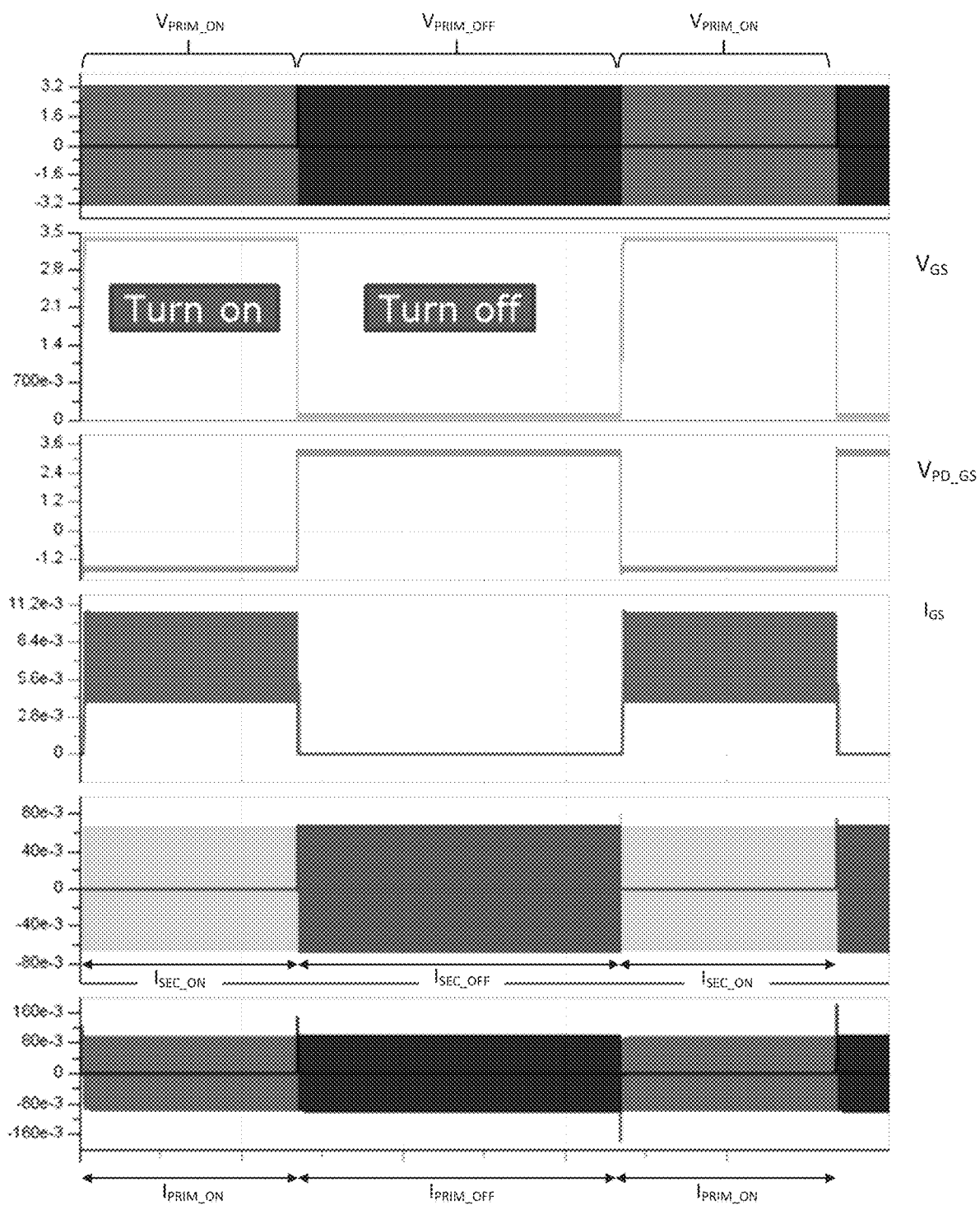
FIG. 7 illustrates voltage and current waveforms corresponding to the circuit of FIG. 6.

FIG. 7 illustrates voltage and current waveforms corresponding to the switch device 600 of FIG. 6. These waveforms are similar to those of FIG. 3A. However, the gate-to-source pulldown voltage $V_{PD\_GS}$ is driven to a negative value (about −1.2V, corresponding to the forward bias voltage of a gate diode) during intervals when the power switch Q1 is turned on. Also, the rectified current $I_{GS}$ driven to the gate of the power switch Q1, at about 8 mA RMS, is lower than the corresponding current in FIG. 3A, as there is no pulldown resistor discharging a portion of the steady-state current in the pulldown circuit 660.

Figure 8:
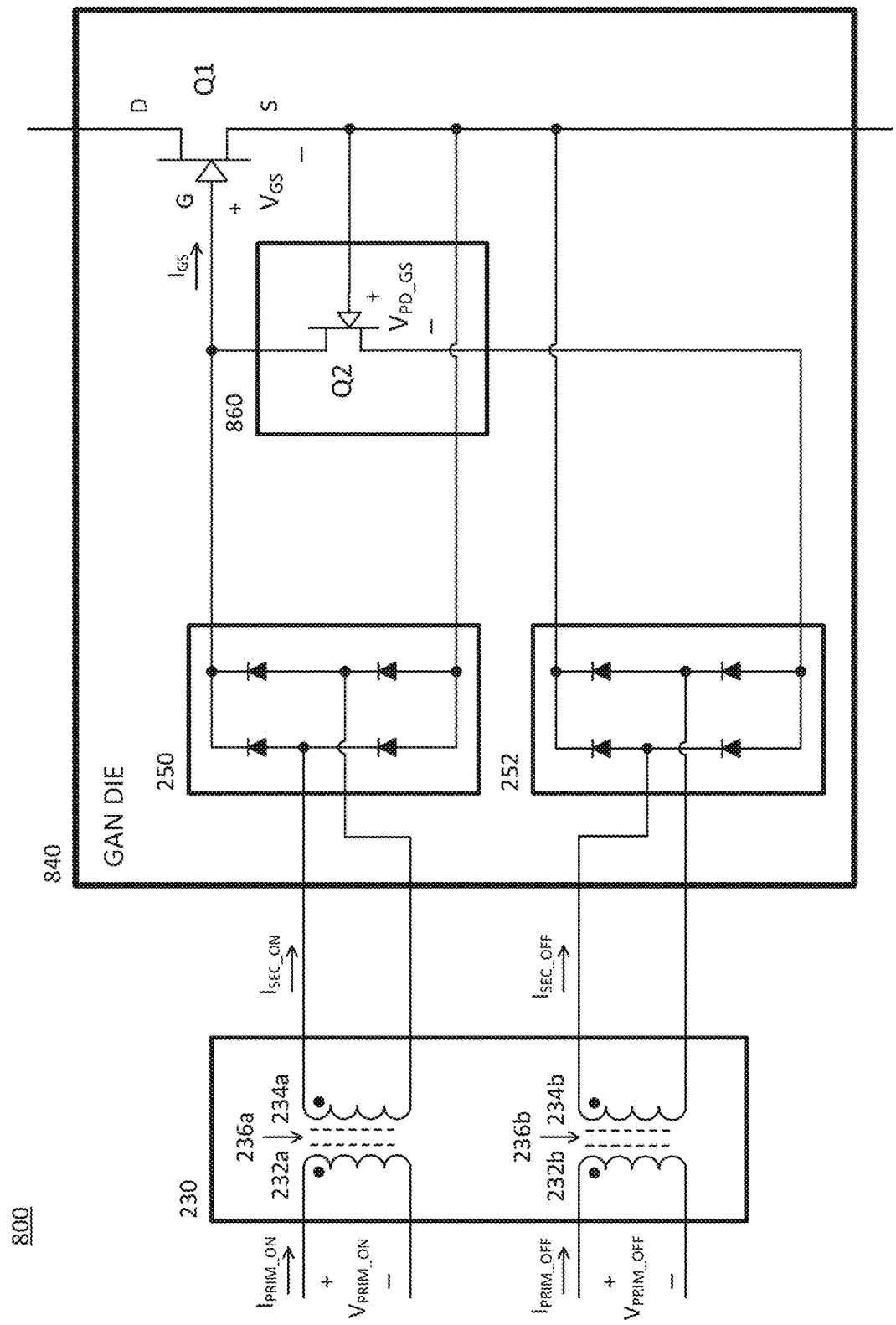
FIG. 8 illustrates a schematic diagram of another circuit topology for a transformer-driven power switch device that uses a normally-off pulldown switch.

FIG. 8 illustrates a further transformer-driven switch device 800, wherein a pulldown circuit 860 includes a cascaded pulldown switch Q2 and requires no pulldown resistor or diode. The gate of the pulldown switch Q2 is connected to the source of the power switch Q1. The turn-off diode bridge (rectifier) 252 is connected across the gate and source of the pulldown switch Q2. As in the previously-described switch devices, the drain of the pulldown switch Q2 is connected to the gate of the power switch Q1, but the source of the pulldown switch Q2 is not connected to the source of the power switch Q1. With this configuration, the power switch Q1 is turned on in a manner similar to that described for previous switch devices, but its turn off differs in that a negative voltage is applied to the gate of the power switch Q1 during the turn-off interval. When the turn-off diode bridge 252 is activated, a positive pulldown gate-to-source voltage $V_{PD\_GS}$ is generated so as to turn on the pulldown switch Q2. With the drain and source of the pulldown switch Q2 shorted together, the gate of the power switch Q1 is connected to the negative side of the turn-off rectifier 252, whereas the source of the power switch Q1 is connected to the positive side of the turn-off diode bridge 252. Hence, the voltage generated by the turn-off rectifier 252 provides a negative voltage across the gate-to-source terminals of the power switch Q1, wherein this negative voltage has the same magnitude as the positive voltage applied across the gate and source terminals of the pulldown switch Q2, i.e., $V_{GS}=V_{PD\_GS}$ when the power switch Q1 is turned off. In addition to providing a relatively fast turn-off transition, the negative voltage at the gate of the power switch Q1 has the added benefit of robustly holding the power switch Q1 in its off state, thereby reducing unintentional turn on of the power switch Q1, e.g., due to noise or ringing.

Figure 9:
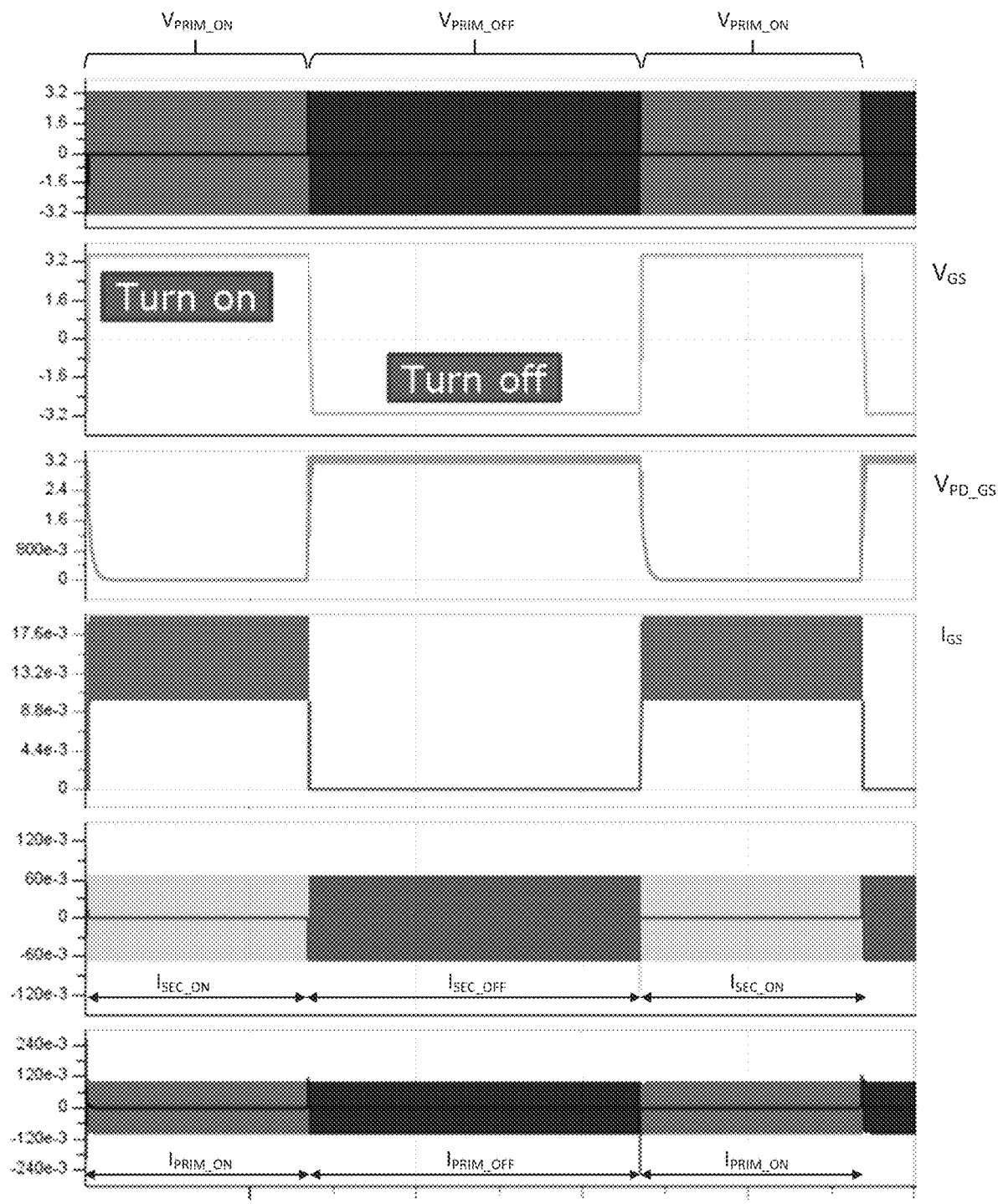
FIG. 9 illustrates voltage and current waveforms corresponding to the circuit of FIG. 8.

FIG. 9 illustrates voltages and currents corresponding to the transformer-driven switch device 800 of FIG. 8. These waveforms are similar to the waveforms corresponding to the previously-described switch devices, with the notable exception that the gate-to-source voltage $V_{GS}$ of the power switch Q1 is driven to a negative value of about −3.3V when the power switch Q1 is driven to its off state. This voltage is the negative of the gate-to-source voltage $V_{PD\_GS}$ (e.g., +3.3V) driven to the pulldown switch Q2 during the off state of the power switch Q1.

Transformer-Based Switch Devices Based on a Normally-on Pulldown Switch

The transformer-based switch devices of the previous section actively pull down the power switch control terminal (gate) using normally-off switches. The following transformer-based switch devices use normally-on pulldown switches instead. While other types of normally-on switches may be used, the following examples use normally-on GaN switches. Such switches are constructed in much the same manner as a normally-off GIT, except without the p-type gate structure typically included within a GIT. Such a normally-on GaN switch may be a HEMT in its native state, e.g., a depletion-mode HEMT. Because a normally-on HEMT may be constructed using the same material, e.g., GaN, as the power switch, the normally-on pulldown switch may be integrated in a GaN die with the power switch in the same manner as a normally-off pulldown switch may be. The normally-on GaN switches used in the below examples conduct (are turned on) when no voltage is applied, or when a voltage that is higher than the switch's threshold is applied to the switch gate. The turn-off switch threshold is a negative voltage typically in the range of −4V to −7V. A normally-on pulldown switch is turned off when a gate-to-source voltage is applied that is below the turn-off threshold.

Figure 10:
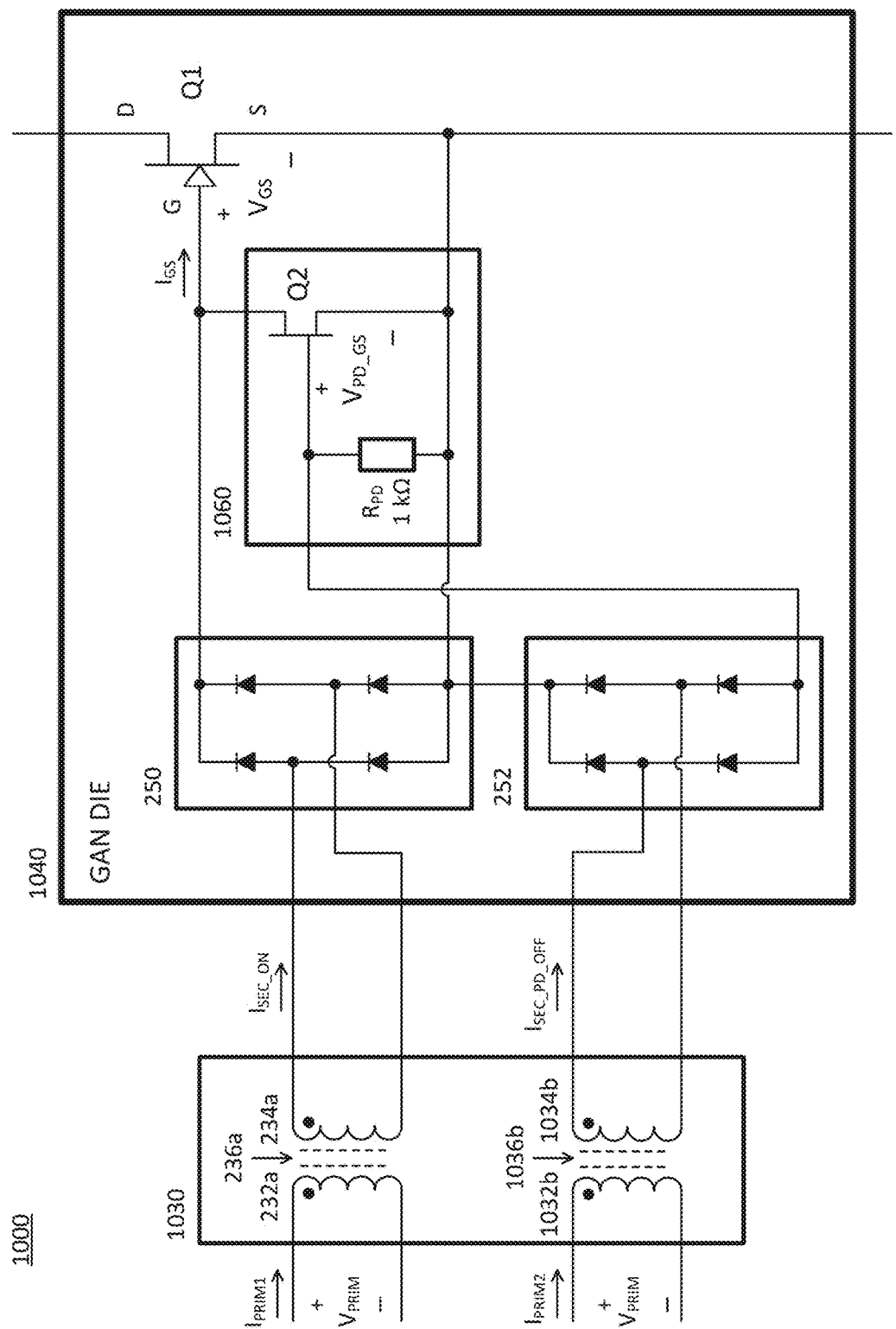
FIG. 10 illustrates a schematic diagram of a circuit topology for a transformer-driven power switch device that uses a normally-on pulldown switch and a pulldown resistor.

FIG. 10 illustrates circuitry for a transformer-driven switch device 1000 that uses a normally-on pulldown switch Q2. The transformer-driven switch device 1000 includes a GaN die 1040 having a power switch Q1, a turn-on rectifier 250, and a pulldown rectifier 252, each of which is similar to corresponding components shown in FIG. 2A. The transformer-driven switch device 1000 additionally comprises a pulldown circuit 1060, which includes a normally-on pulldown switch Q2 and a pulldown resistor $R_{PD}$. In contrast to the previously-described circuits, the pulldown rectifier 252 is configured so as to apply a negative voltage to the gate of the pulldown switch Q2, relative to its source, during intervals when the power switch Q1 is turned on. During turn-off intervals of the power switch Q1, the resistor $R_{PD}$ equalizes the charge between the gate and source of the pulldown switch Q2, thereby driving the pulldown gate-to-source voltage $V_{PD\_GS}$ to zero, so as to turn on the normally-on pulldown switch Q2.

By using the normally-on pulldown switch Q2, rather than a normally-off pulldown switch, the power switch Q1 defaults to an off (nonconducting) state. The pulldown switch Q2 shorts the gate and source of the power switch Q1, unless the gate of the pulldown switch Q2 is driven with a sufficiently negative voltage. This default state provides an additional benefit that the power switch Q1 is not turned on during start-up or no-power conditions. This, in turn, prevents problems with shoot-through when the power switch Q1 is part of a half-bridge or similar configuration, thereby improving safety and reliability of the system. Such failsafe operation is accomplished without requiring complicated circuitry that applies a negative gate voltage to the power switch gate before the system start-up, as is included in typical GaN driver circuits. The other circuits described below and based on normally-on pulldown switches also have these benefits.

The normally-on pulldown switch Q2 of FIG. 10 has a turn-off threshold of −4V or lower (more negative), i.e., the switch Q2 is turned off when a gate-to-source voltage $V_{PD\_GS}$ of less than −4V or lower is applied, and is turned on otherwise. To achieve such a negative voltage, the transformer 1030 includes primary and secondary windings 1032b, 1034b having a turns ratio of about 1:3 or higher, which differs from the turns ratio (e.g., 1:2) of previously-described transformers, e.g., the transformer 230 of FIG. 2A and the windings 232a, 234a. The turn-off threshold of the pulldown switch Q2 may differ due to production variation or with different implementations/types of the pulldown switch Q2. The transformer turns ratio and/or the type and number of diodes in the pulldown rectifier 252 may be adapted to accommodate different turn-off thresholds of the pulldown switch Q2.

Figure 11:
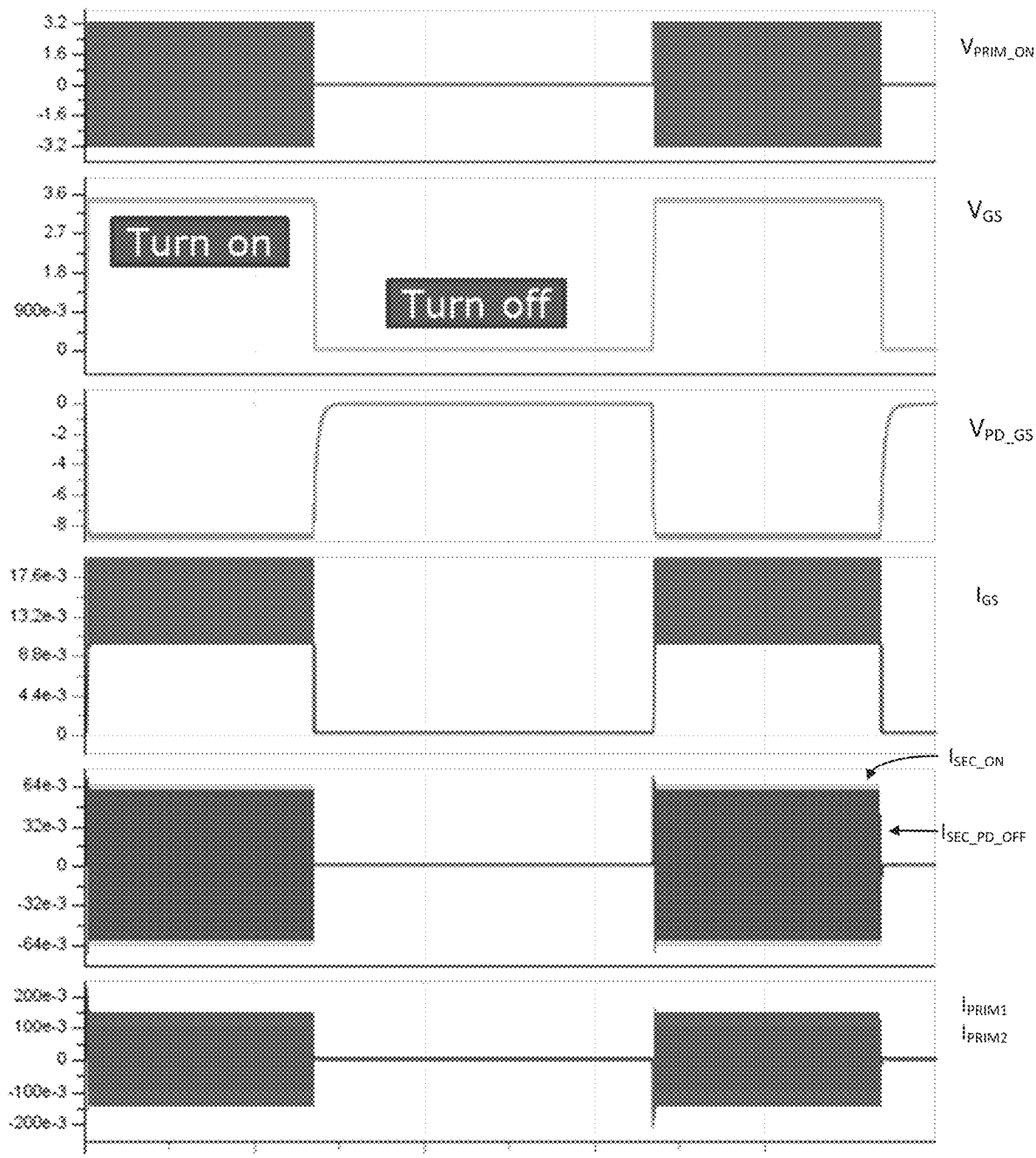
FIG. 11 illustrates voltage and current waveforms corresponding to the circuit of FIG. 10.

FIG. 11 illustrates voltage and current waveforms corresponding to the transformer-driven switch device 1000 of FIG. 10. The same primary-side voltage $V_{PRIM\_ON}$ is applied to both primary-side windings 232a, 1032b. This voltage $V_{PRIM\_ON}$ is active (alternating between about +3V and −3V) during turn-on intervals of the power switch Q1, and is inactive (approximately 0V) during turn-off intervals of the power switch Q1. As shown in FIG. 11, the timing of the secondary-side current waveforms $I_{SEC\_ON}$, $I_{SEC\_PD\_OFF}$ is similar, but their current levels, during turn-on intervals of the power switch Q1, differ slightly due to the different turns ratios of the transformer windings (e.g., 1:2 vs. 1:4). When the primary-side voltage $V_{PRIM\_ON}$ is active and the power switch Q1 is turned on, the gate-to-source voltage $V_{PD\_GS}$ of the pulldown switch Q2 is driven to a negative voltage, e.g., −9V, as shown in the voltage waveform $V_{PD\_GS}$. This negative voltage holds the pulldown switch Q2 in its off state. When the primary-side voltage $V_{PRIM\_ON}$ is inactive (e.g., about 0V) and the power switch Q1 is turned off, resistor $R_{PD}$ pulls the voltage $V_{PD\_GS}$ to 0V, thereby turning on the pulldown switch Q2 and shorting the gate and source terminals of the power switch Q1, so as to hold the power switch Q1 in an off state.

Figure 12:
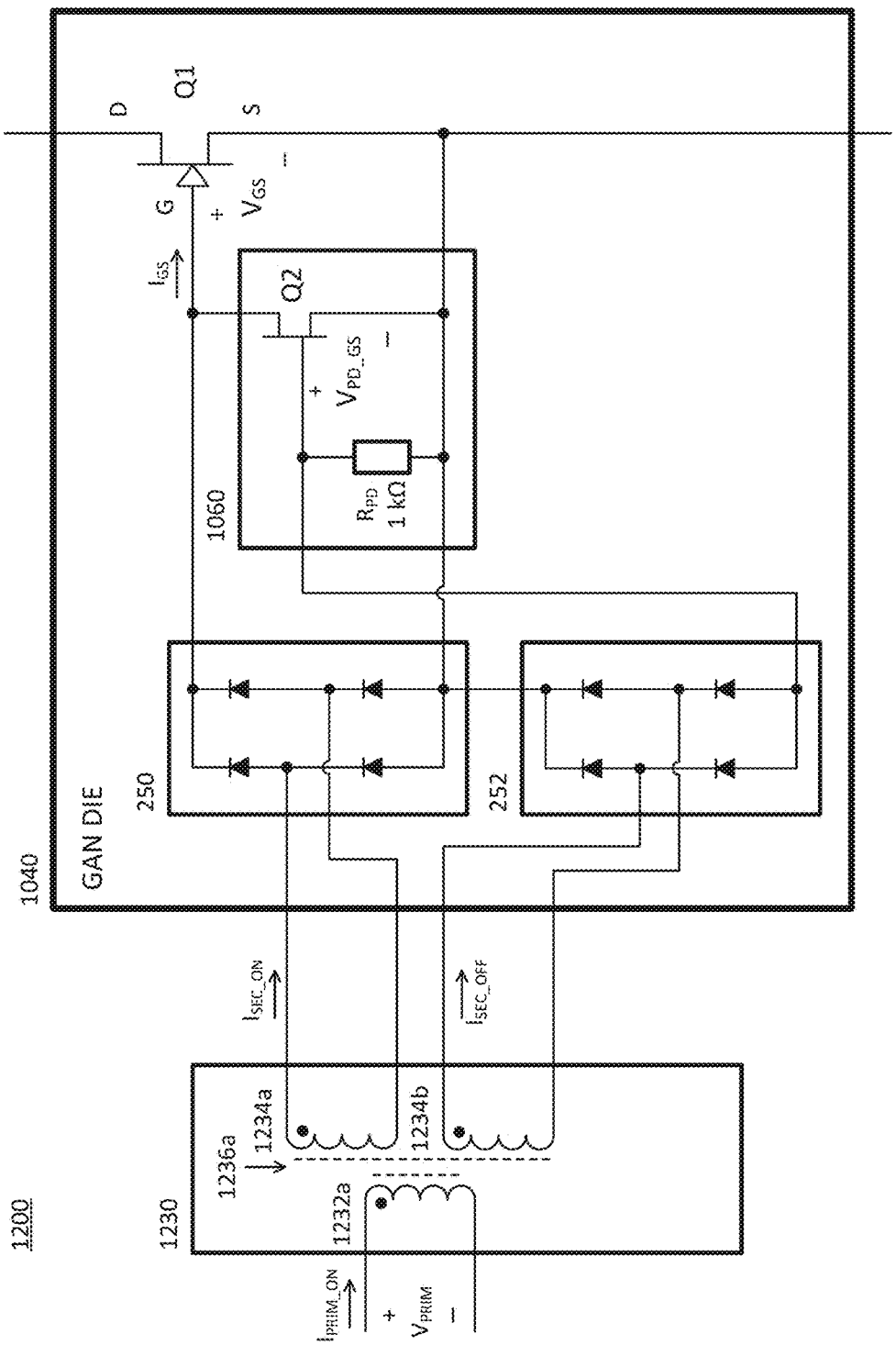
FIG. 12 illustrates a schematic diagram of another circuit topology for a transformer-driven power switch device that uses a normally-on pulldown switch and a pulldown resistor.

The primary-side windings 232a, 1032b receive the same input and the "off" signal is basically just the absence of the "on" signal, as shown in the waveform $V_{PRAM\_ON}$ of FIG. 11. One implication of this is that no power is needed to maintain the off state of the power switch Q1, which differs from the previously-described circuits that use normally-off pulldown switches. Related to this, the power consumption of the transformer-driven switch device 1000 is dependent on the duty cycle of the switching of the power switch Q1. Additionally, because the same signal is applied to both primary-side windings, the transformer 1030 can be simplified to have a single primary-side winding coupled to both secondary-side windings. FIG. 12 illustrates such a transformer-driven switch device 1200. The transformer 1230 of FIG. 12 includes a single primary-side winding 1232a, which is coupled to both secondary-side windings 1234a, 1234b. A magnetic core 1236a may be included to assist the coupling, or may be omitted. The turns ratios from the primary-side winding 1232a to the secondary-side windings 1234a, 1234b are, respectively, 1:2 and 1:4. Otherwise, the circuit 1200 of FIG. 12 is the same as the circuit 1000 of FIG. 10, and the voltage and current waveforms for the circuit 1200 are similar to those shown in FIG. 11.

Figure 13A:
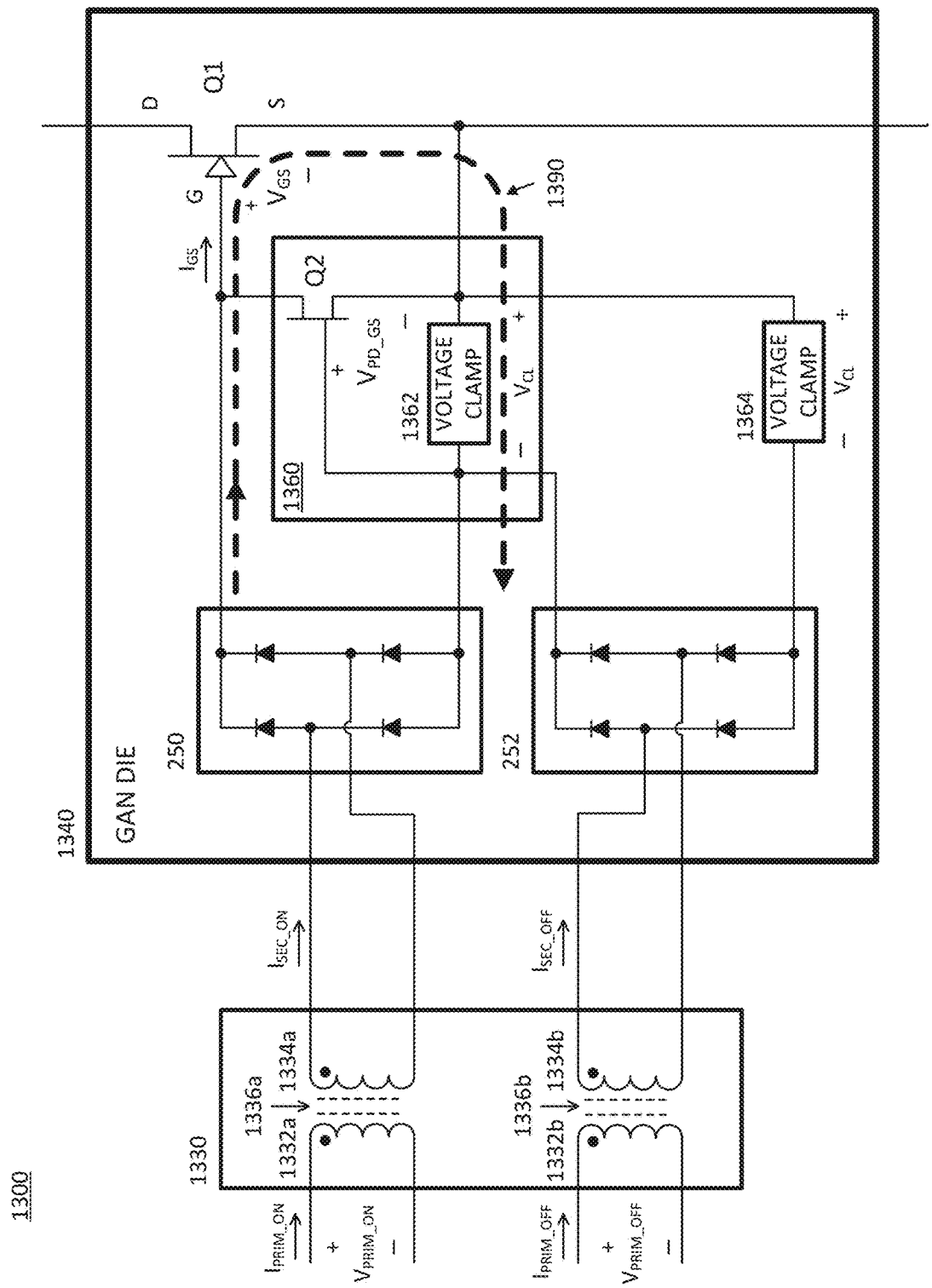

FIG. 13A illustrates a transformer-driven switch device 1300 that uses a normally-on pulldown switch Q2, but which replaces the passive discharge of the gate of the switch Q2 with an active discharge. This device 1300 is analogous to the device 400 of FIG. 4, which also actively discharges the gate of a pulldown switch, and provides similar benefits as the device 400. The device 1300 includes a transformer 1330 and a GaN die 1340.

The transformer 1330 is similar to the transformer 230 of FIG. 2A, except that the transformer 1330 may have different turns ratios, e.g., 1:5 between first windings 1332a, 1334a, and 1:3 between windings 1332b, 1334b. The GaN die 1340 includes a turn-on rectifier 250, a turn-off rectifier 252, and a power switch Q1, each of which is similar to corresponding components in the device 1000 of FIG. 10. The GaN die 1340 additionally includes a pulldown circuit 1360, which has a normally-on pulldown switch Q2 and a voltage clamp 1362. The voltage clamp 1362 functions the same as a diode with a large forward-bias threshold, e.g., 9V, so as to generate a voltage drop $V_{CL}$ from the source to the gate of the pulldown switch Q2. When the voltage clamp 1362 is activated, i.e., a sufficient voltage is provided so as to forward bias the voltage clamp 1362, a negative voltage is driven onto the pulldown gate, relative to its source, so as to hold the pulldown switch Q2 in its off state. For example, if the voltage clamp 1362 provides a bias voltage of +9V, $V_{PD\_GS}$=−9V when the voltage clamp 1362 is forward biased. Because turn-off thresholds for normally-on switches are typically −4V to −7V, a pulldown gate-to-source voltage $V_{PD\_GS}$=−9V will robustly hold the pulldown switch Q2 off.

The voltage clamp 1362 is part of the turn-on current loop 1390, such that the voltage clamp 1362 forces the pulldown switch Q2 to its off state when the power switch Q1 is turned on. A sufficiently high voltage output from the turn-on rectifier 250 will turn on the power switch Q1 and forward bias the voltage clamp 1362, thereby turning off the pulldown switch Q2. For a primary-side input $V_{PRIM\_ON}$ alternating between +3V and −3V and with a transformer turns ratio of 1:5, the resultant secondary-side voltage provided to the turn-on rectifier 250 has a magnitude of 15V. Assuming a voltage drop of 2.4V within the turn-on rectifier 250, the resultant rectifier output voltage is 12.6V, which is apportioned between the clamp voltage $V_{CL}$ (e.g., 9V) and the gate-to-source voltage $V_{GS}$ (e.g., 3.6V) of the power switch Q1.

The turn-off rectifier 252 applies a voltage to the pulldown switch Q2 when the power switch Q1 is turned off, so as to turn the pulldown switch Q2 on, thereby shorting the gate and the source of the power switch Q1. (Any voltage higher than the threshold voltage, e.g., 4V, will turn the pulldown switch Q2 on.) A second voltage clamp 1364 is included in the turn-off current loop so as to avoid activating the turn-off rectifier 252 during turn-on intervals of the power switch Q1. (Without the second voltage claim 1364, during turn-on intervals, current would flow through the turn-off rectifier 252 and bypass the voltage clamp 1362.) For a primary-side input of +/−3V and a turns ratio of 1:4, the resultant secondary-side voltage provided to the turn-off rectifier 252 is +/−12V. Assuming the turn-off rectifier 252 incurs a voltage drop of 2.4V, the resultant voltage of +9.6V forward biases the second voltage clamp 1364, having a clamp voltage $V_{CL}$ (e.g., 9V), and provides, e.g., a pulldown gate-to-source voltage $V_{PD\_GS}$=0.6V. This voltage turns on the pulldown switch Q2 which, in turn, turns off the power switch Q1.

As described previously in relation to FIG. 2B, gated diodes and PN diodes may be constructed from GaN transistors. The voltage clamps 1362, 1364 may include a series stack of such diodes. FIG. 13B illustrates examples of voltage clamps 1362a, 1362b, 1362c based upon gated diodes and/or PN diodes. The first voltage clamp 1362a includes a plurality of gated diodes connected in series. Each such gated diode typically has a knee (threshold) voltage of 0.9V to 1.5V. For example, if N=6 in the first voltage clamp 1362a and the threshold voltage is 1.5V, the first voltage clamp 1362a would provide a clamp voltage $V_{CL}$=9V. The illustrated second voltage clamp 1362b includes three PN diodes connected in series, wherein each of these PN diodes has a knee (threshold) voltage of 3V. Hence, the illustrated second voltage clamp 1362b would provide a clamp voltage $V_{CL}$=9V. The voltage clamps 1362, 1364 of FIG. 13A each have clamp voltages of 9V and, hence, may use the circuit of the second voltage clamp 1362b. The illustrated third voltage clamp 1362c includes a mixture of two PN diodes and one gated diode. Using the representative threshold voltages described above, the third voltage clamp 1362c provides a clamp voltage $V_{CL}$=7.2V. Other combinations of gated diodes and PN diodes may be assembled to achieve desired clamp voltage levels, e.g., to provide a clamp voltage $V_{CL}$ that corresponds to a turn-off threshold for a particular normally-on pulldown switch.

Figure 14:
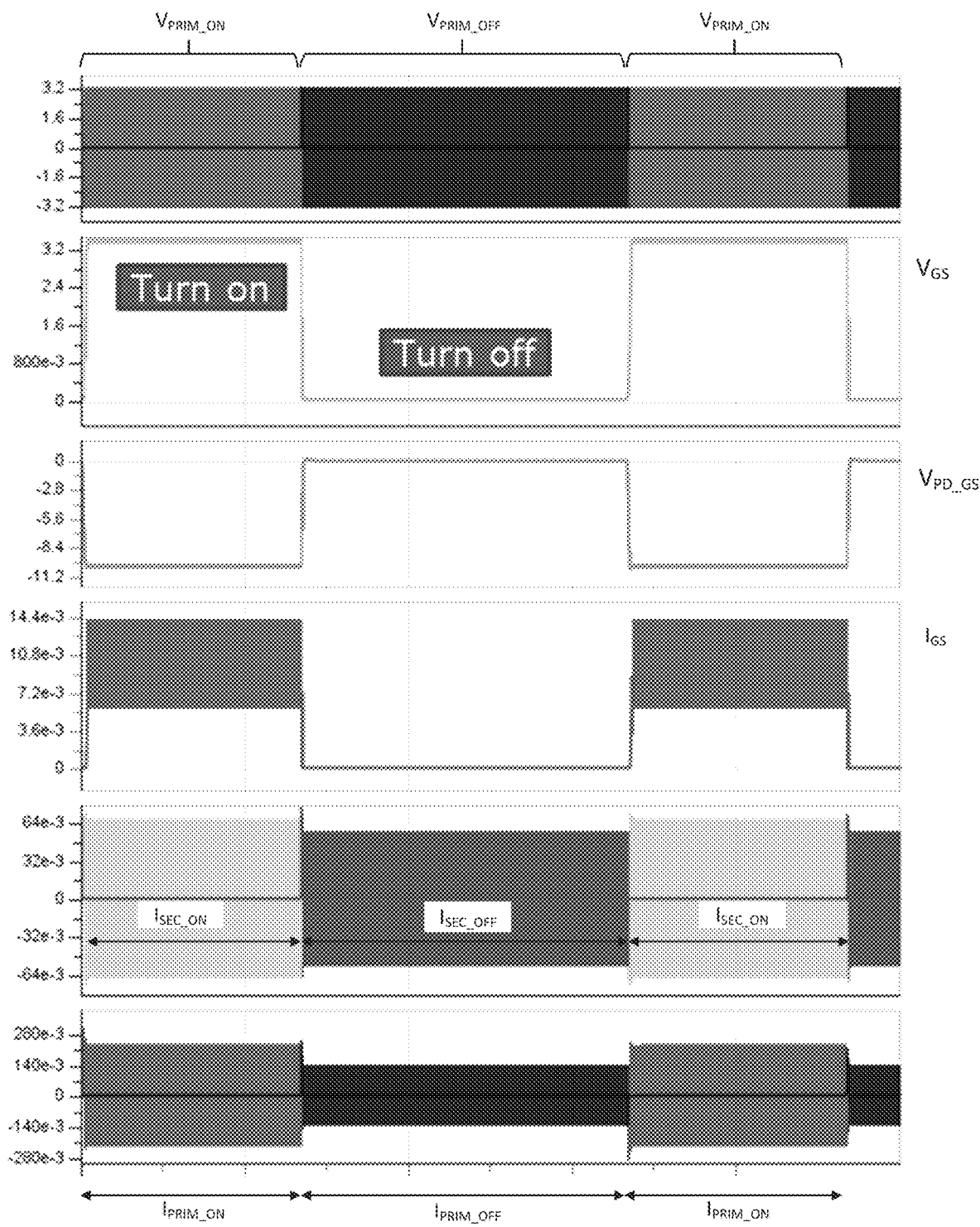
FIG. 14 illustrates voltage and current waveforms corresponding to the circuit of FIG. 13A.

FIG. 14 illustrates voltage and current waveforms corresponding to the transformer-driven power switch device 1300 of FIG. 13A. As in previous examples, a primary-side turn-on signal $V_{PRIM\_ON}$ alternates between +3V and −3V during turn-on intervals of the power switch Q1. After passing through the transformer 1330 (turns ratio 1:5) and the turn-on rectifier 250, the resultant voltage of 15V provides a gate-to-source voltage $V_{GS}$ of 3.6V and a pulldown gate-to-source voltage $V_{PD\_GS}$ of −9V, as illustrated. During turn-off intervals of the power switch Q1, the primary-side turn-off signal $V_{PRIM\_OFF}$ alternates between +3V and −3V. After passing through the transformer 1330 (turns ratio 1:4) and the turn-off rectifier 252, the resultant voltage of 9.6V forward biases the second voltage clamp 1364 and provides a pulldown gate-to-source voltage $V_{PD\_GS}$ near zero, as illustrated. This turns on the pulldown switch Q2, driving the gate-to-source voltage $V_{GS}$ of the power switch Q1 to 0V, as illustrated.

Figure 15:
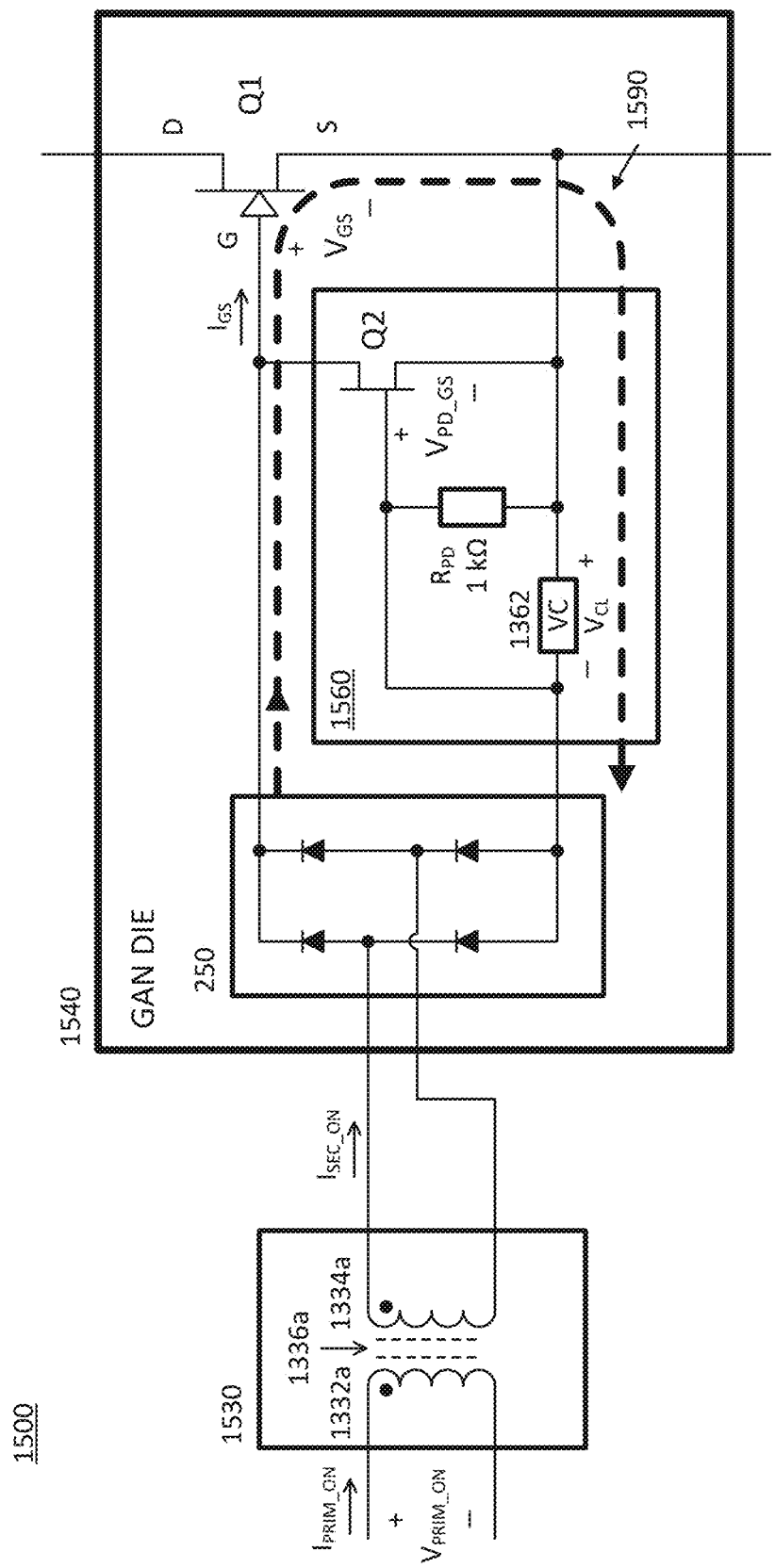
FIG. 15 illustrates a schematic diagram of a circuit topology for a transformer-driven power switch device that uses a normally-on pulldown switch that is passively discharged.

While the switch device 1300 has the advantages of providing active turn on and turn off of the power switch Q1, and the associated control of the turn on and turn off switching speed, the switch device 1300 includes two sets of transformer windings, two voltage clamps, and two rectifiers. For applications that do not require active control of the turn-off speed of a power switch, a simpler circuit that also provides failsafe protection may be desired. FIG. 15 illustrates such a simpler circuit.

FIG. 15 illustrates a transformer-driven switch device 1500 that is similar to that of FIG. 13A, except that the active discharge provided by the turn-off rectifier 252 is replaced with a passive discharge provided by a pulldown resistor, thereby simplifying the circuitry. In addition to eliminating the turn-off rectifier 252 of FIG. 13A, such passive discharging enables the deletion of one set of transformer windings 1332b, 1334b and the second voltage clamp 1364. The resultant device circuitry 1500 includes a transformer 1530 and a GaN die 1540.

The transformer 1530 includes primary and secondary windings 1332a, 1334a and an optional core 1336a, as in the transformer 1330 of FIG. 13A, but does not have a second set of windings for driving a turn-off rectifier.

The GaN die 1540 includes a turn-on rectifier 250 and pulldown circuitry 1560. As in the device 1300, the gate-to-source voltage $V_{GS}$ of the power switch Q1 and the voltage clamp 1362 are part of the same current loop 1590. Hence, an active signal $V_{PRIM\_ON}$, e.g., alternating between +3V and −3V, generates a secondary-side voltage that is rectified by the turn-on rectifier 250 and simultaneously applied to the power switch gate-source and across the voltage clamp 1362. Similar to the circuit 1300 of FIG. 13A, the current loop 1590 ensures that the pulldown switch Q2 is turned off when the power switch Q1 is turned on.

In addition to the pulldown switch Q2 and the voltage clamp 1362, the pulldown circuitry 1560 includes a pulldown resistor $R_{PD}$. When no turn-on signal is applied to the transformer 1530, the pulldown resistor $R_{PD}$ discharges the pulldown gate, so as to force the pulldown gate-to-source voltage $V_{PD\_GS}$ to 0V. This results in the pulldown switch Q2 turning on and shorting the gate and source of the power switch Q1, thereby holding the power switch Q1 in its off state. As with the pulldown resistors described previously, this pulldown resistor $R_{PD}$ has a resistance of 1 kΩ and is created as a 2DEG channel within the GaN die. Other resistances may be used, so as to alter the rate at which the pulldown gate is discharged.

The device 1500 has many of the same advantages as the device 1300, such as providing safe and reliable turn-off of the power switch Q1, e.g., avoiding shoot-through, duty-cycle dependent power consumption, and using a single turn-on current loop to ensure the switches Q1, Q2 are in their intended states. The device 1500 is also relatively simple, but does not support dynamic control of the turn-off switch speed as do other circuits herein that actively turn off the power switch using application of a turn-off signal.

Figure 16:
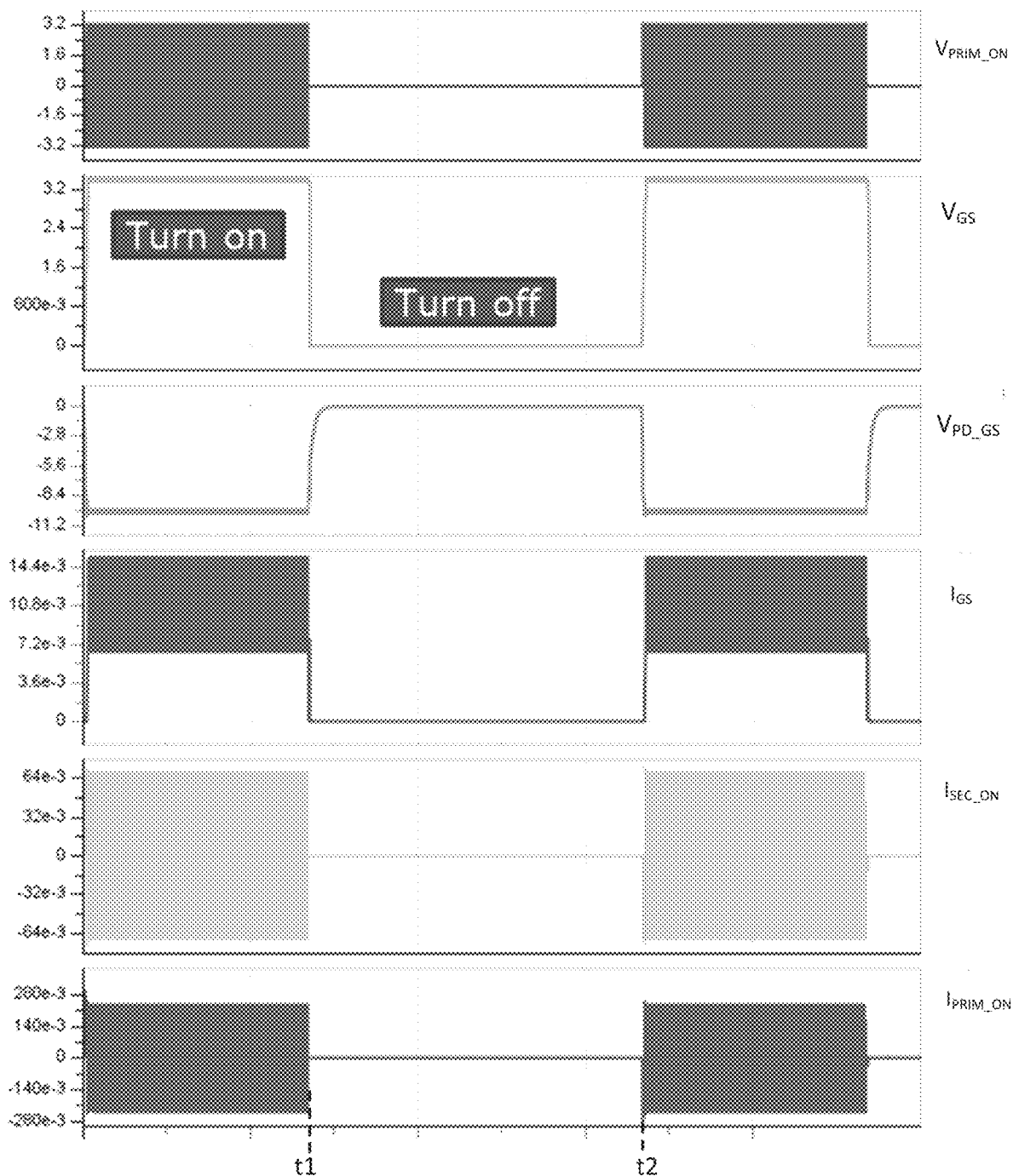
FIG. 16 illustrates voltage and current waveforms corresponding to the circuit of FIG. 15.

FIG. 16 illustrates voltages and currents corresponding to the device 1500 of FIG. 15. These waveforms are largely the same as the waveforms of FIG. 14, except that there are no voltage or current waveforms corresponding to turn-off signals. The turn-off transition of the power switch Q1, e.g., at time t1, is determined by the rate at which the pulldown gate discharges, which is determined by the resistance of the pulldown resistor RFD. The turn-on transition of the power switch Q1, e.g., at time t2, is determined by the energy transferred from the turn-on signal $V_{PRIM\_ON}$. Hence, the turn-on transition may be altered by changing the voltage of this signal, the current of this signal, skipping pulses, etc.

Transformer-Based Switch Devices Having No Pulldown Switch

The transformer-based switch devices of the previous sections used pulldown switches to actively discharge the power switch control terminal (gate). The following transformer-based switch devices control conductivity of a power switch Q1 without pulldown switches.

Figure 17:
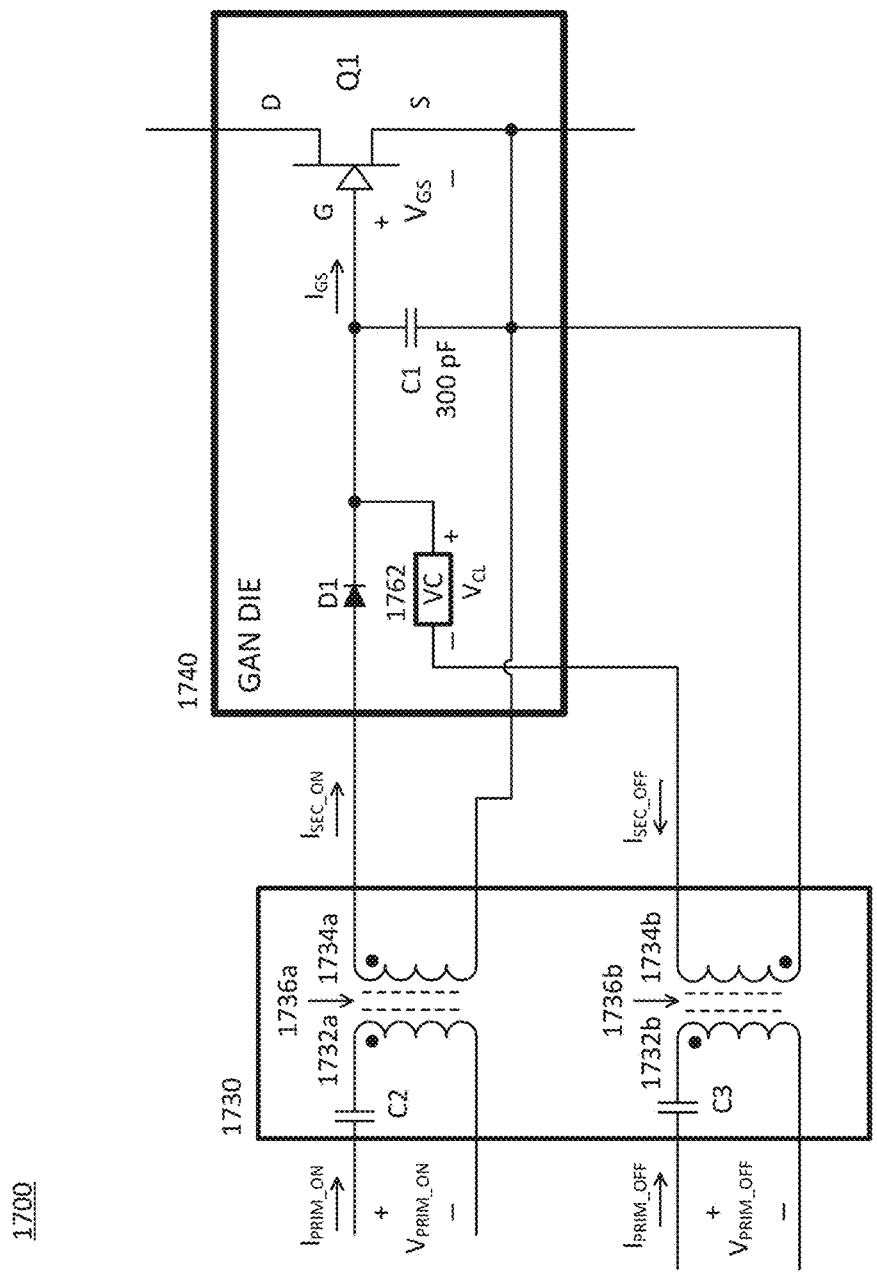
FIG. 17 illustrates a schematic diagram of a circuit topology for a transformer-driven power switch device that does not include pulldown switches.

FIG. 17 illustrates a transformer-driven switch device 1700 having a transformer 1730 and a GaN die 1740. The GaN die 1740 includes a turn-on diode D1, and a turn-off voltage clamp 1762. The turn-on diode D1 may be a gated diode as used in the previously-described rectifiers, and the voltage clamp 1762 may include several gated diodes stacked together, as shown in FIG. 13B. The turn-on diode D1 provides half-wave rectification of the AC signal output from the secondary winding 1734a. A capacitor C1 is coupled across the gate and source of the power switch Q1, so as to smooth the half-wave rectified voltage and maintain a steady-state current to the power switch gate during its turn-on intervals. The capacitor C1 can have a capacitance of 300 pF or other values and may be a metal-insulator-metal capacitor integrated within the GaN died 1740.

The primary-side signals $V_{PRIM\_ON}$, $V_{PRIM\_OFF}$ for this device 1700 may be single-ended, such that a single half bridge may drive each of these signals, rather than the full bridges typically used to generate differential signals as described previously. Small DC blocking capacitors C2, C3, e.g., 100 pF, may be included in the transformer 1730, so as to prevent the currents from drifting to excessive values. These capacitors C2, C3 may be monolithically integrated in the same silicon die as the transformer 1730 when the transformer 1730 is a cureless transformer implemented in a silicon die.

The voltage clamp 1762 functions as a diode, but requires a larger bias voltage than the diode D1 so as to not affect operation during turn-on intervals. The voltage clamp 1762 in this example includes three gated diodes stacked in series, thereby providing a forward bias voltage of 4*1.2V=4.8V. When a turn-off signal $V_{PRIM\_OFF}$ is applied to the transformer 1730, the turn-off voltage clamp 1762 acts as a half-wave rectifier and only positive current flows from the power switch gate to the transformer 1730, so as to discharge the power switch gate.

The device 1700 of FIG. 17 has the advantages of using relatively simple circuitry and only needing single-ended drive signals. The diode D1, voltage clamp 1762, capacitor C1 and power switch Q1 may be monolithically integrated in the same GaN die 1740, providing cost and size advantages as well as reducing parasitic inductances and minimizing the length of current loops. While no current is required to maintain the off state of the power switch Q1 if zero volts is used to turn off the power switch Q1, a negative turn-off voltage may be desired to provide faster turn-off transitions, as in the illustrated device 1700. A disadvantage of the device 1700 is that the gate and source of the power switch Q1 are no longer directly shorted together, and the gate voltage is only clamped to zero or negative when the turn-off signal $V_{PRIM\_OFF}$ is active, which may not safely hold the power switch Q1 in an off state during no-power and start-up conditions.

Figure 18:
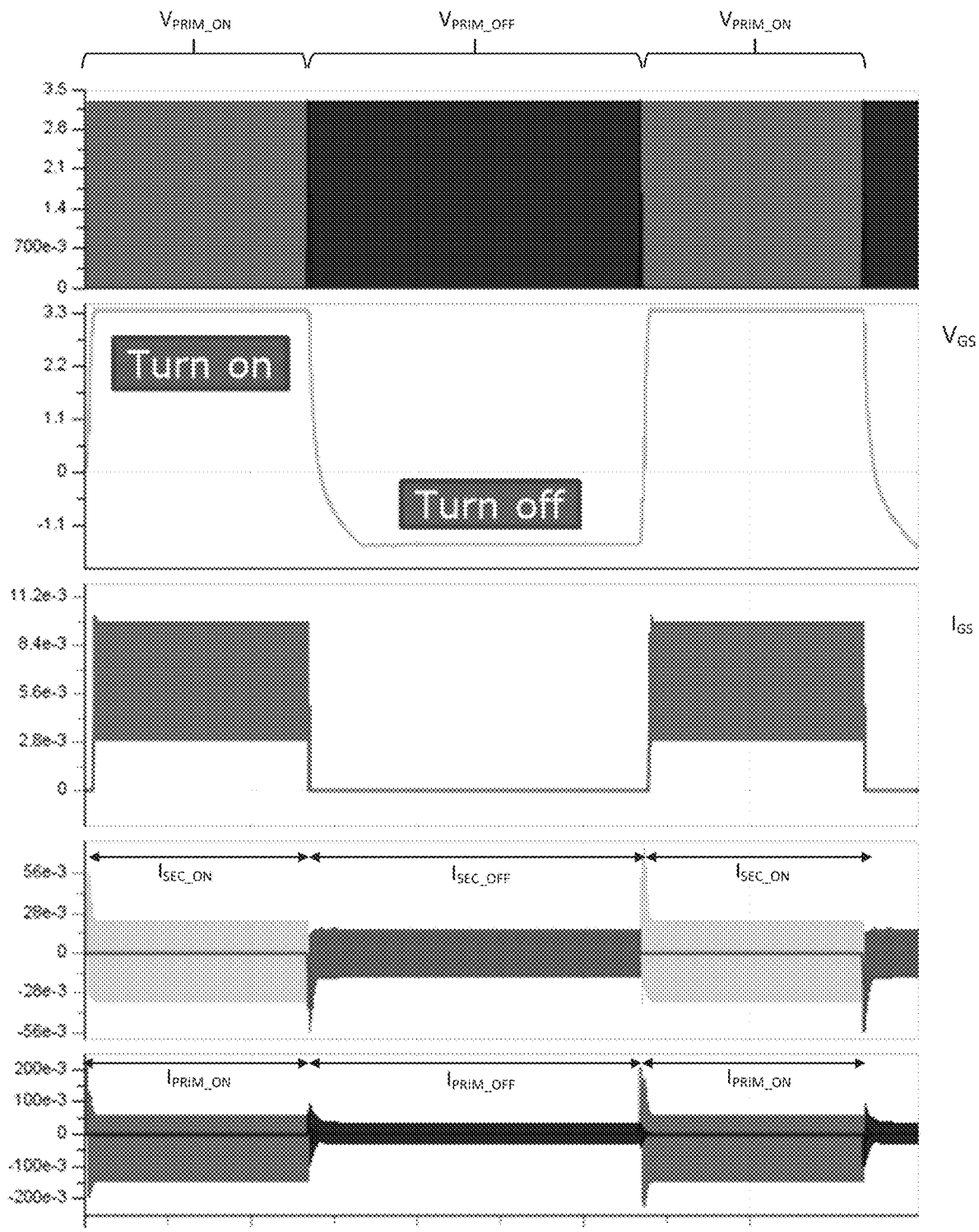
FIG. 18 illustrates voltage and current waveforms corresponding to the circuit of FIG. 17.

FIG. 18 illustrates voltage and current waveforms corresponding to the device 1700 of FIG. 17. During turn-on intervals, a turn-on signal $V_{PRIM\_ON}$ alternates between 0 and 3V which, after being stepped up by the transformer 1730 and rectified by the turn-on diode D1, provides a turn-on voltage $V_{GS}$ and current $I_{GS}$ to the gate of the power switch Q1. During turn-off intervals, a turn-off signal $V_{PRIM\_OFF}$ alternates between 0 and 3V which, after being stepped up by the transformer 1730 and rectified by the voltage clamp (stacked diode) 1762, provides a turn-off voltage $V_{GS}$ of about −1.2V. Such a negative voltage serves to more quickly discharge the power switch gate thereby speeding the turn-off transition, and more robustly holds the power switch Q1 in its off state.

Figure 19:
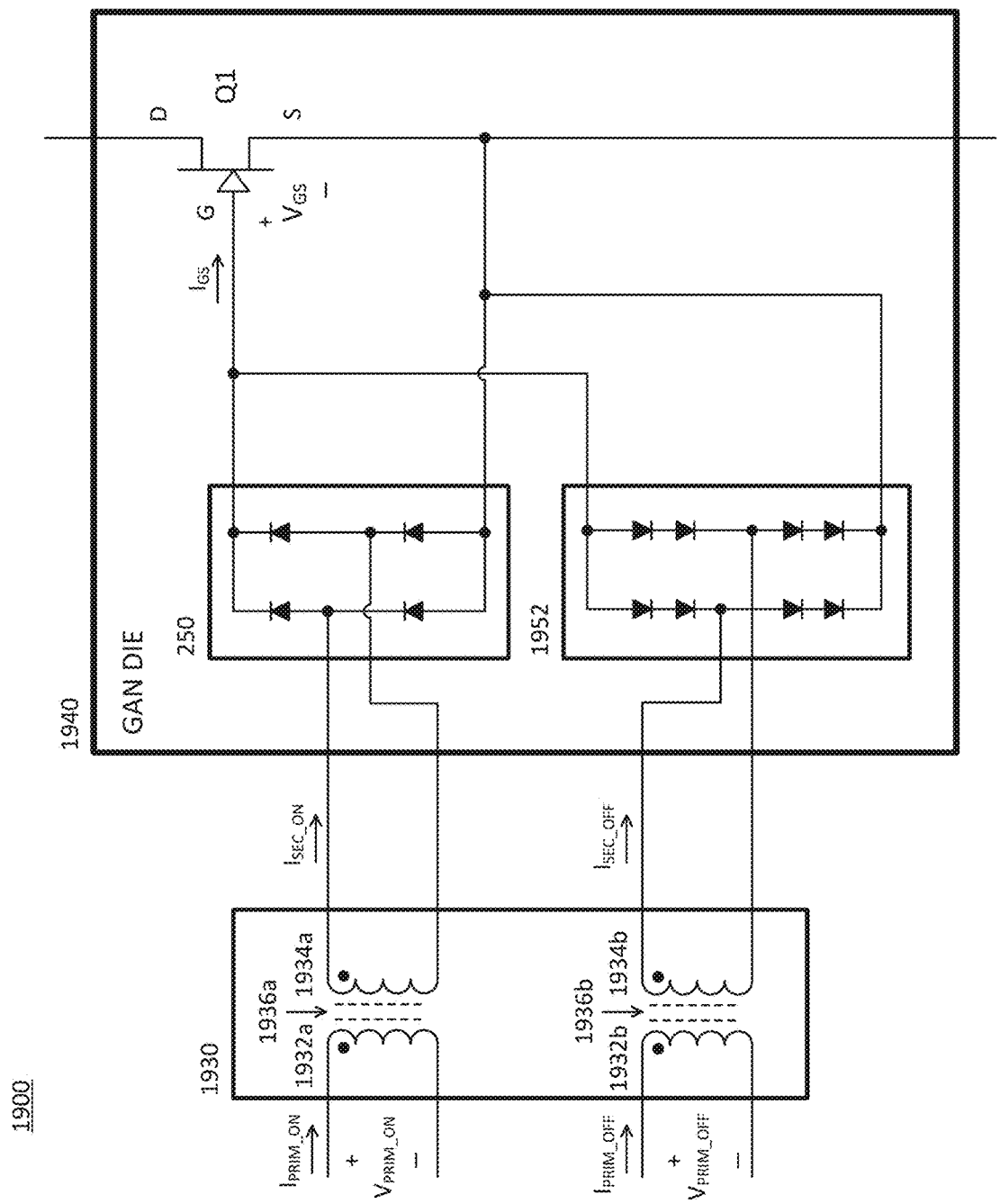
FIG. 19 illustrates a schematic diagram of a circuit topology for a transformer-driven power switch device that does not include pulldown switches, and which uses rectifier bridges to directly drive a power switch gate.

FIG. 19 illustrates a transformer-driven switch device 1900 that also has no pulldown switches. For this device, the primary-side turn-on and turn-off signals $V_{PRIM\_ON}$, $V_{PRIM\_OFF}$ are differentially driven, which means a signal generator using a full bridge may be used. (For ease of illustration, such a signal generator is not shown.) Due to the differentially-applied input signals, no DC blocking capacitors are required within the transformer (e.g., silicon die) 1930. Otherwise, the transformer 1930 is largely the same as the transformer 1730 of FIG. 17, except for the turns ratios of the two pairs of windings 1932a, 1934a, 1932b, 1934b. These turns ratios may be, e.g., 1:2, or may be chosen to match the particular rectifier voltage drops and turn-on threshold voltage of power switch Q1.

The GaN die includes a turn-on rectifier 250, a turn-off rectifier 1952, and a power switch Q1. The turn-on rectifier 250 provides full-wave rectification, such that a smoothing capacitor is not needed at the power switch gate. The turn-off rectifier 1952 includes two stacked gated diodes within each branch, so that the turn-off rectifier 1952 is not unintentionally activated during turn-on intervals of the power switch Q1, and so as to apply a negative voltage to the power switch gate during turn-off intervals. (This negative voltage more quickly discharges the power switch gate at the turn-off transition, and more robustly holds the power switch Q1 in its off state.)

Figure 20:
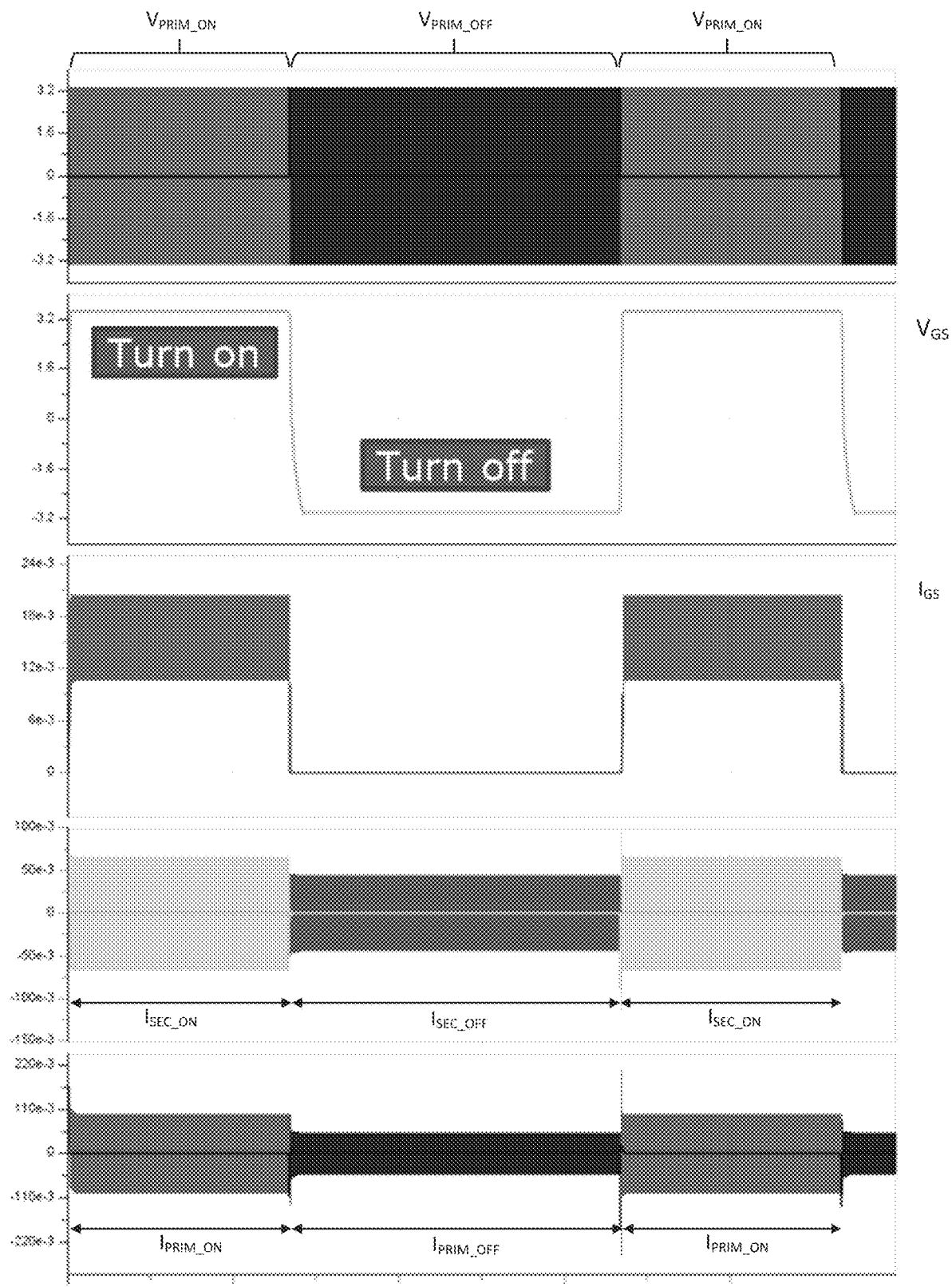
FIG. 20 illustrates voltage and current waveforms corresponding to the circuit of FIG. 19.

FIG. 20 illustrates voltage and current waveforms corresponding to the device 1900 of FIG. 19. During turn-on intervals, the primary-side AC turn-on voltage $V_{PRIM\_ON}$ alternates between +3V and −3V. After this voltage $V_{PRIM\_ON}$ is stepped up, e.g., by a factor of 2, by the transformer 1930 and rectified by the turn-on rectifier 250 (which induces a voltage drop of about 2.4V), a gate-to-source voltage $V_{GS}$=3.6V and a current $I_{GS}$ is provided to and turns on the power switch Q1. During turn-off intervals, the primary-side AC turn-of voltage $V_{PRIM\_OFF}$ alternates between +3V and −3V. After this voltage $V_{PRIM\_OFF}$ is stepped up, e.g., by a factor of 2.6, by the transformer 1930 and rectified by the turn-off rectifier 1952, a gate-to-source voltage $V_{GS}$ of about −3V is applied to the power switch Q1, so as to hold the power switch Q1 off. The device 1900 provides an advantage over the device 1700 of FIG. 17, in that the turn-off transition of the device 1900 is much faster.

Figure 21:
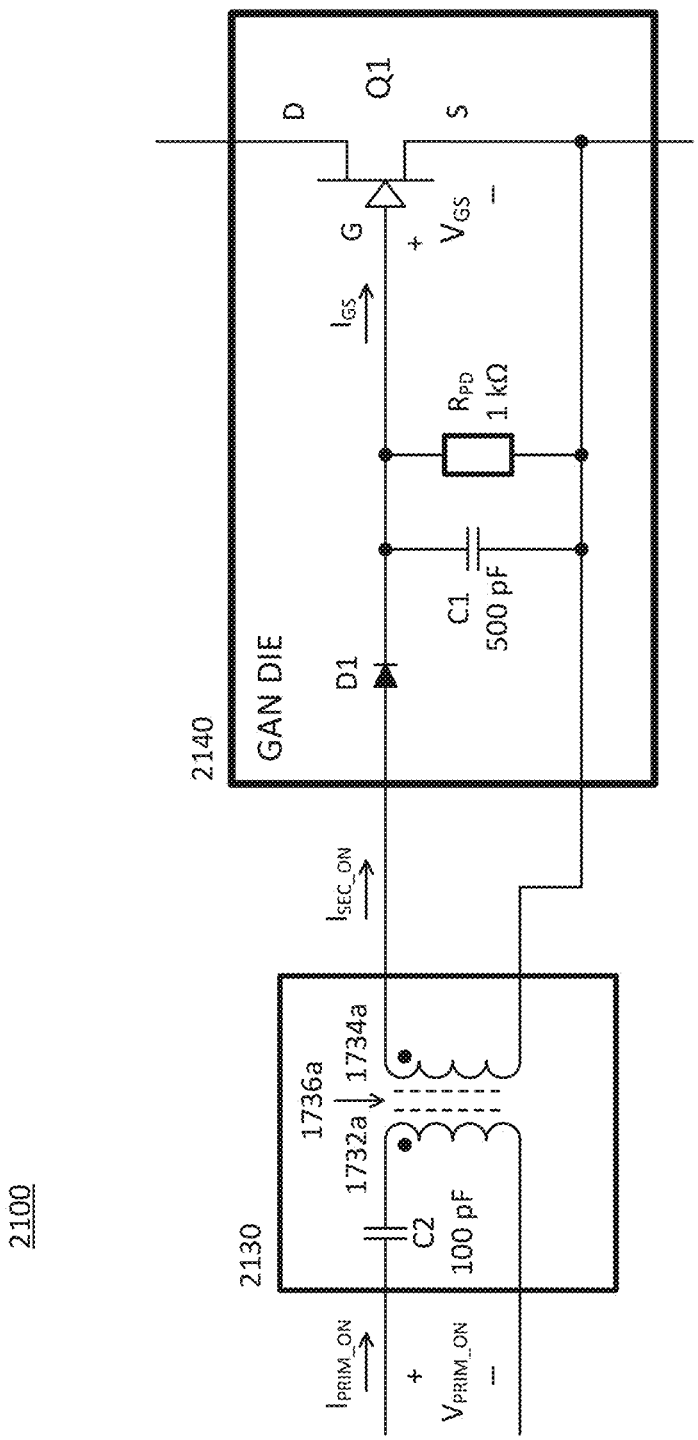
FIG. 21 illustrates a schematic diagram of a circuit topology for a transformer-driven power switch device that does not include pulldown switches, and which passively discharges a power switch gate.

FIG. 21 illustrates a transformer-driven switch device 2100 that is similar to that of FIG. 17, except the turn off is provided by a pulldown resistor $R_{PD}$, which replaces the voltage clamp 1762, thereby simplifying the circuitry of the GaN die 2140. Related to this, the transformer (e.g., silicon die) 2130 only has one set of windings 1732*a*, 1734*a*. The primary-side turn-on voltage $V_{PRIM\_ON}$ may be single ended. During turn-on intervals, a primary-side turn-on signal $V_{PRIM\_ON}$ alternates between two values (e.g., 0 and 3V), and the resultant secondary-side voltage and current are rectified by the diode D1. Because the diode D1 only provides half-wave rectification, a capacitor C1, illustrated as 500 pF, may be useful so as to smooth the voltage and current provided to the power switch gate during turn-on intervals. During turn-off intervals, the pulldown resistor $R_{PD}$ discharges the power switch gate, thereby passively turning off the power switch Q1. The device 2100 has the advantage of circuit simplicity and minimal design, but has a disadvantage of having a relatively slow turn-off transition. However, applications that do not require a fast turn-off transition, such as some synchronous rectification bridges, may benefit from the simple circuitry provided by this device 2100.

Figure 22:
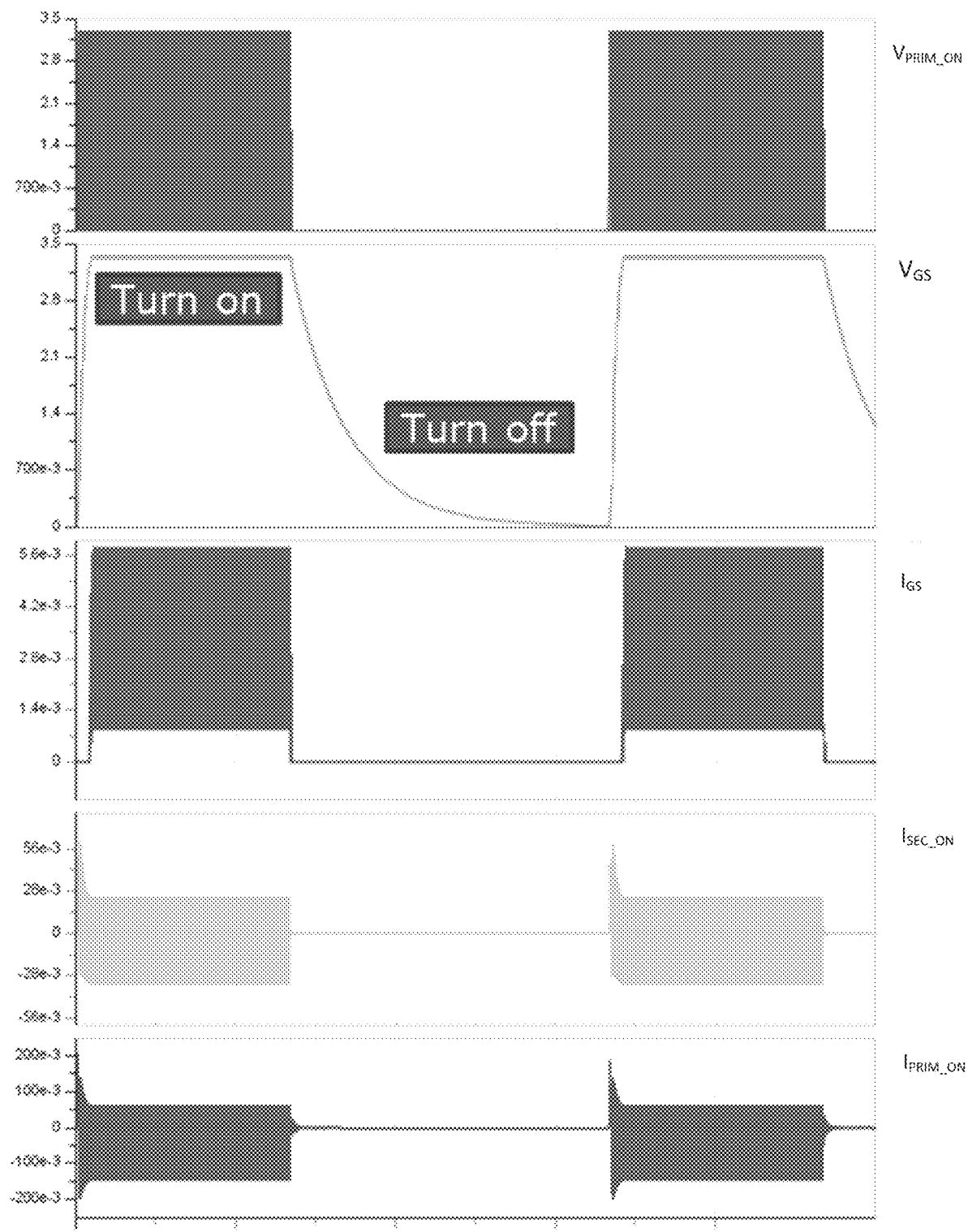
FIG. 22 illustrates voltage and current waveforms corresponding to the circuit of FIG. 21.

FIG. 22 illustrates voltage and current waveforms corresponding to the device 2100 of FIG. 21. These waveforms are similar to the waveforms of FIG. 20, with the notable exceptions that there are no turn-off signals ($V_{PRIM\_OFF}$, $I_{PRIM\_OFF}$, $I_{SEC\_OFF}$). Also, the gate-to-source voltage $V_{GS}$ of the power switch Q1 is seen to decay more slowly. (A smaller pulldown resistor $R_{PD}$ would yield a faster turn-off transition, but at the potential expense of slower turn-on transitions and higher power consumption during the turn-on intervals.)

Transformer-Based Switch Device System Package (SiP)

Figure 23:
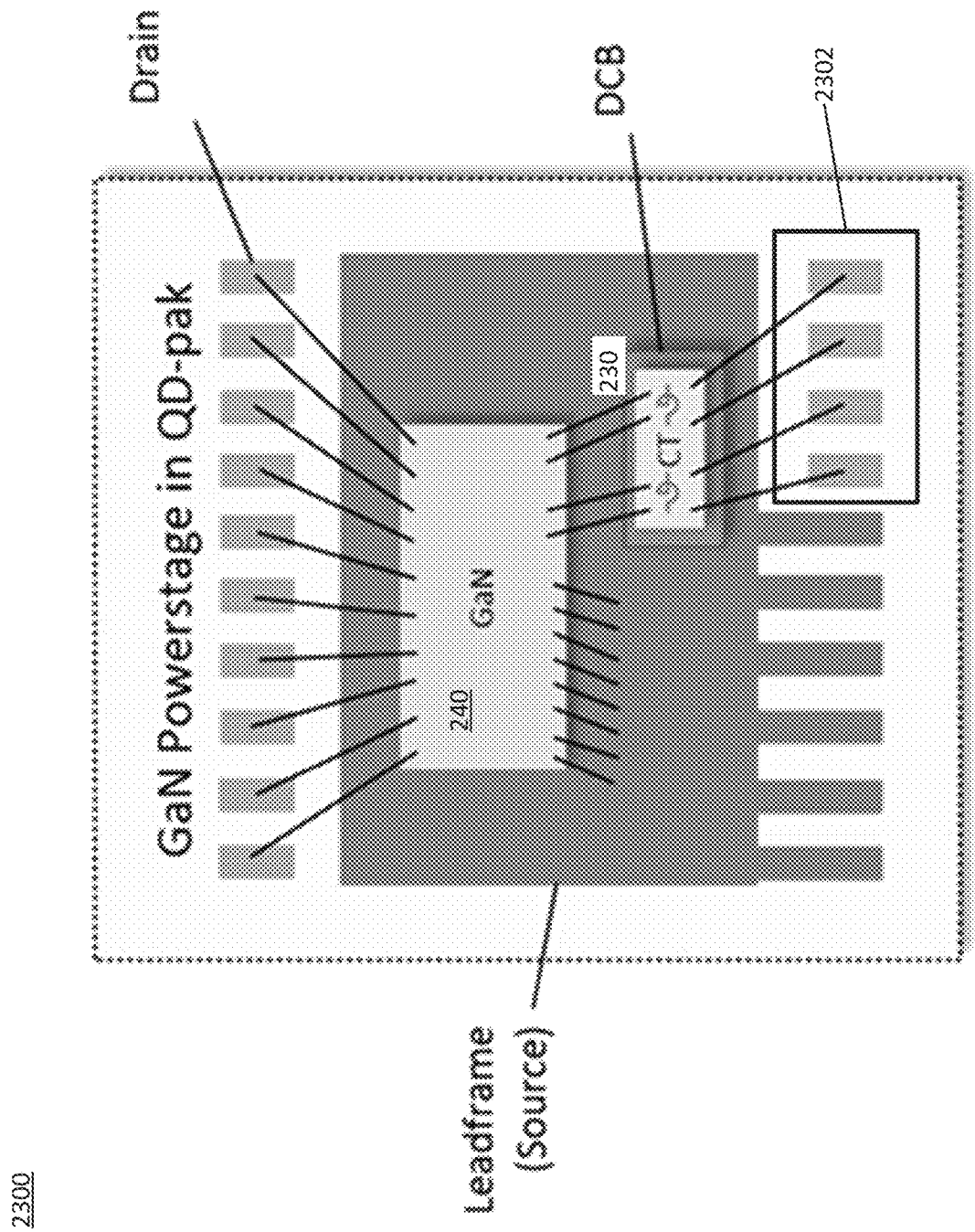
FIG. 23 illustrates a system in package that includes a transformer-driven power switch device.

Any of the transformer-based switch devices described herein may be advantageously integrated within a same package. FIG. 23 illustrates an example of such a system in package 2300 corresponding, e.g., to the device 200 of FIG. 2A. A coreless transformer 230, which is preferably implemented within a silicon die, has inputs that are bonded to leads 2302 of the package 2300. Outputs of the coreless transformer 230 are provided to the GaN die 240, which includes, e.g., a power switch Q1 and driving circuitry according to the transformer-driven switch device 200 described herein. A source terminal of the power switch Q1 within the GaN die 240 is bonded to a leadframe of the package 2300 which, in turn, is connected to leads of the package 2300. A drain of the power switch Q1 is bonded, e.g., using wire bonds, to leads of the package 2300. The SiP provides an integrated device that includes a power switch Q1 and any needed level shifting, isolation, driver power supply, etc.

Transformer-Based Bidirectional Switch Device

Figure 24:
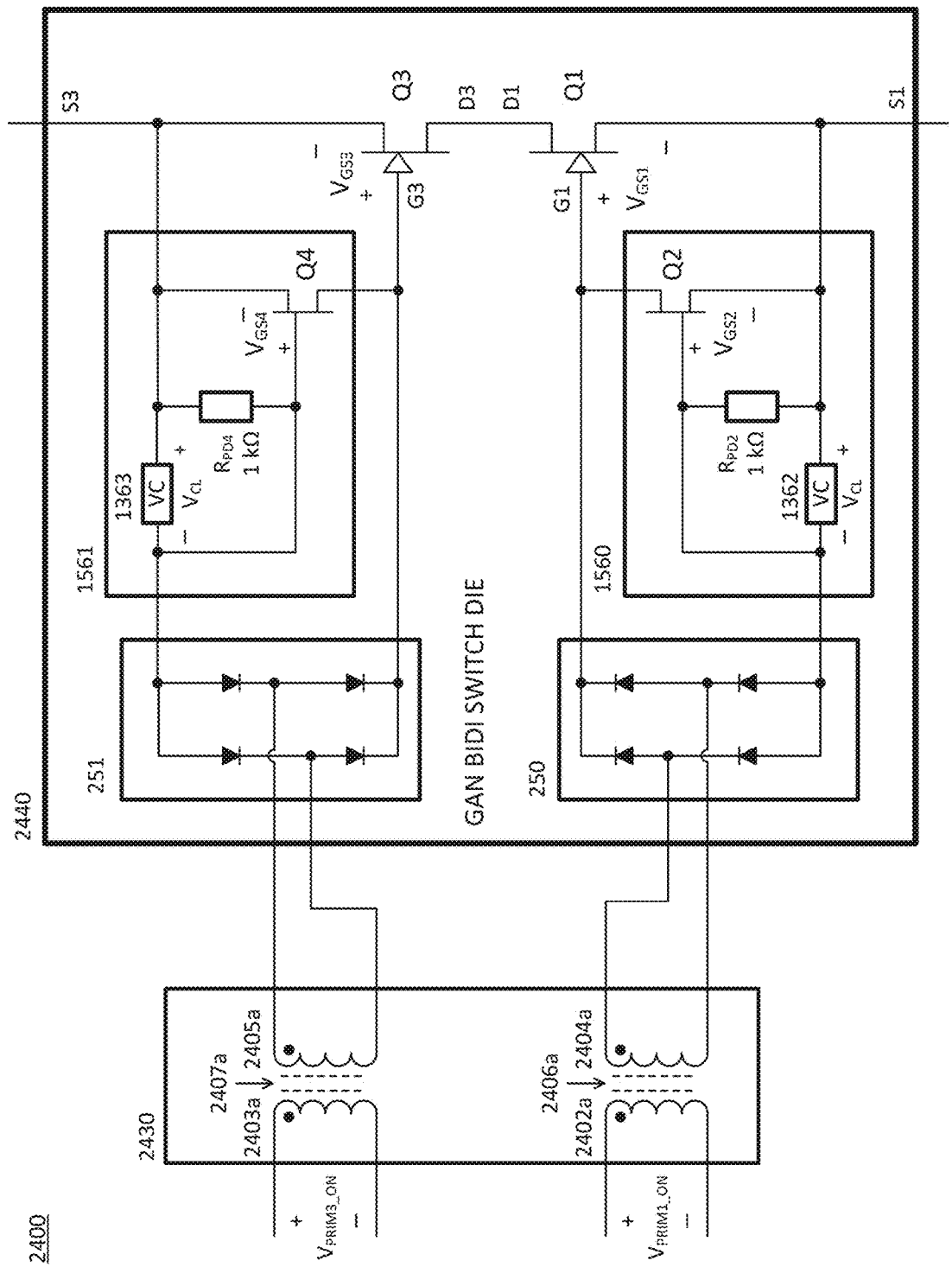
FIG. 24 illustrates a schematic diagram of a circuit topology for a transformer-driven bidirectional power switch device.

The previous descriptions focus on transformer-based switch devices that each include a discrete GaN switch. Advantageously, the described driving circuits may be applied to other topologies, other power switch types, and multiple switches in a single package. FIG. 24 illustrates an example in which two GaN power switches are integrated in a single GaN die, and a single transformer chip (e.g., a coreless transformer implemented in a silicon die) provides driving signals to the GaN die. The power switches in the GaN die may be individually controlled, or may be controlled together so as to effect an ideal switch, i.e., a bidirectional (bidi) switch that is able to block current in both directions. The illustrated device 2400 reduces the high expense and complex drive circuitry typically associated with driving bidirectional switches generally, and bidirectional GaN switches in particular. The transformer-driven bidirectional switch device 2400 of FIG. 24 uses circuitry similar to the device 1500 of FIG. 15. However, it should be understood that the other transformer-driven switch devices described previously may be similarly arranged to create a bidirectional switch.

The bidirectional switch device 2400 includes a first (lower) portion having circuitry that is the same as that of FIG. 15. The lower portion includes first transformer windings 2402*a*, 2404*a*, an optional first core 2406*a*, a first turn-on rectifier 250, a first pull down circuit 1560, and a first power switch Q1. The device 2400 further includes a second (upper) portion having circuitry that is the mirror image of the first portion. The second portion includes second transformer windings 2403*a*, 2405*a*, an optional second core 2407*a*, a second turn-on rectifier 251, a second pulldown circuit 1561, and another power switch Q3. The drain terminals D1, D3 of the power switches Q1, Q3 are coupled together. Source terminals S1, S3 of the power switches Q1, Q3 are provided for external connection to the GaN bidirectional switch die 2440. As illustrated, the bidirectional switch device 2400 is spread across a silicon die including the transformer 2430 and a GaN die 2440 including the power switches Q1, Q3 and related circuitry for controlling the power switches.

Transformer-Based Switch Devices with Normally-on Power Switches

Figure 25:
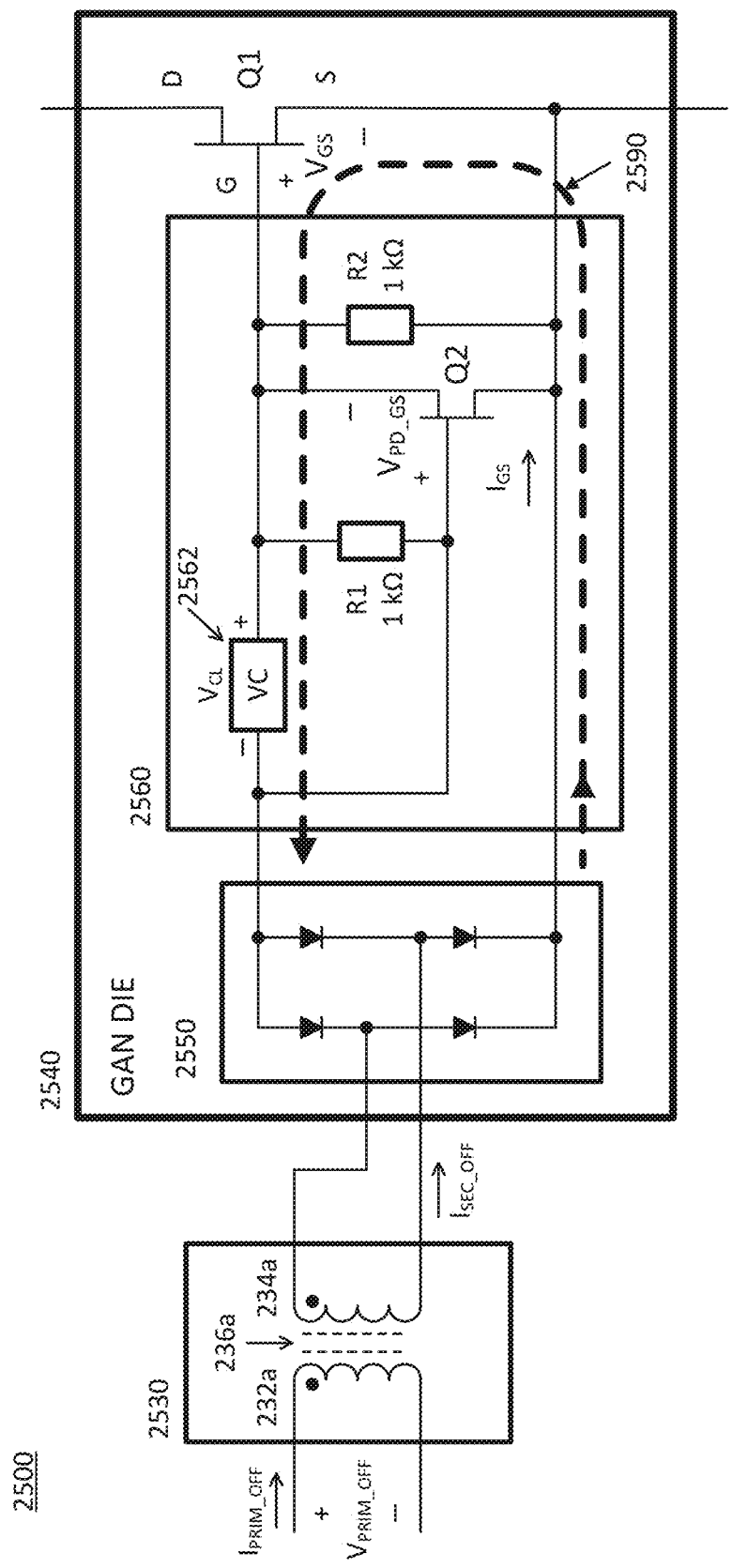
FIG. 25 illustrates a schematic diagram of a circuit topology for a transformer-driven power switch device including a normally-on power switch.

The previous examples of transformer-based switch devices include normally-off power switches. The circuit topologies described previously may be adapted to control a normally-on power switch. FIG. 25 illustrates a transformer-driven switch device 2500 that includes a normally-on power switch Q1. The device 2500 includes a transformer 2530 and a GaN die 2540. The circuitry of device 2500 is an inverted version of the circuitry for device 1500 in FIG. 15, but includes an additional resistor R2, which couples the source to the gate of the power switch Q1. In contrast to the power switch Q1 within the device 1500 of FIG. 15, the power switch Q1 of device 2500 is turned off when an active signal is applied to the transformer 2530, and is turned on otherwise.

By default, the normally-on pulldown switch Q2 conducts, thereby shorting the source and gate of the power switch Q1. With its gate-to-source voltage $V_{GS}$=0, the normally-on power switch is turned on in this default state. The pulldown resistor R1 equalizes the voltage across the pulldown gate and pulldown source after a turn-off interval, thereby forcing the pulldown switch Q2 and power switch Q1 back to their default (on) states.

When an active turn-off signal $V_{PRIM\_OFF}$ is applied to the transformer 2530, e.g., a signal alternating between +3V and −3V, the rectifier 2550 rectifies the corresponding secondary-side signal and supplies a current to the current loop 2590. The voltage provided by the rectifier 2550 to this current loop 2590 is split between the gate-to-source voltage $V_{GS}$ of the power switch Q1 and the voltage clamp 2562. The voltage clamp 2562 may be constructed using gated diodes which, in this example, provide a forward bias threshold (clamping voltage $V_{CL}$) of 8V. The additional resistor R2 provides a parallel current path to the source-to-gate path. The parallel path of resistor R2 sustains a continuous current during turn-off intervals, so as to maintain a negative gate-to-source voltage $V_{GS}$, thereby maintaining the off state of the power switch Q1.

Figure 26:
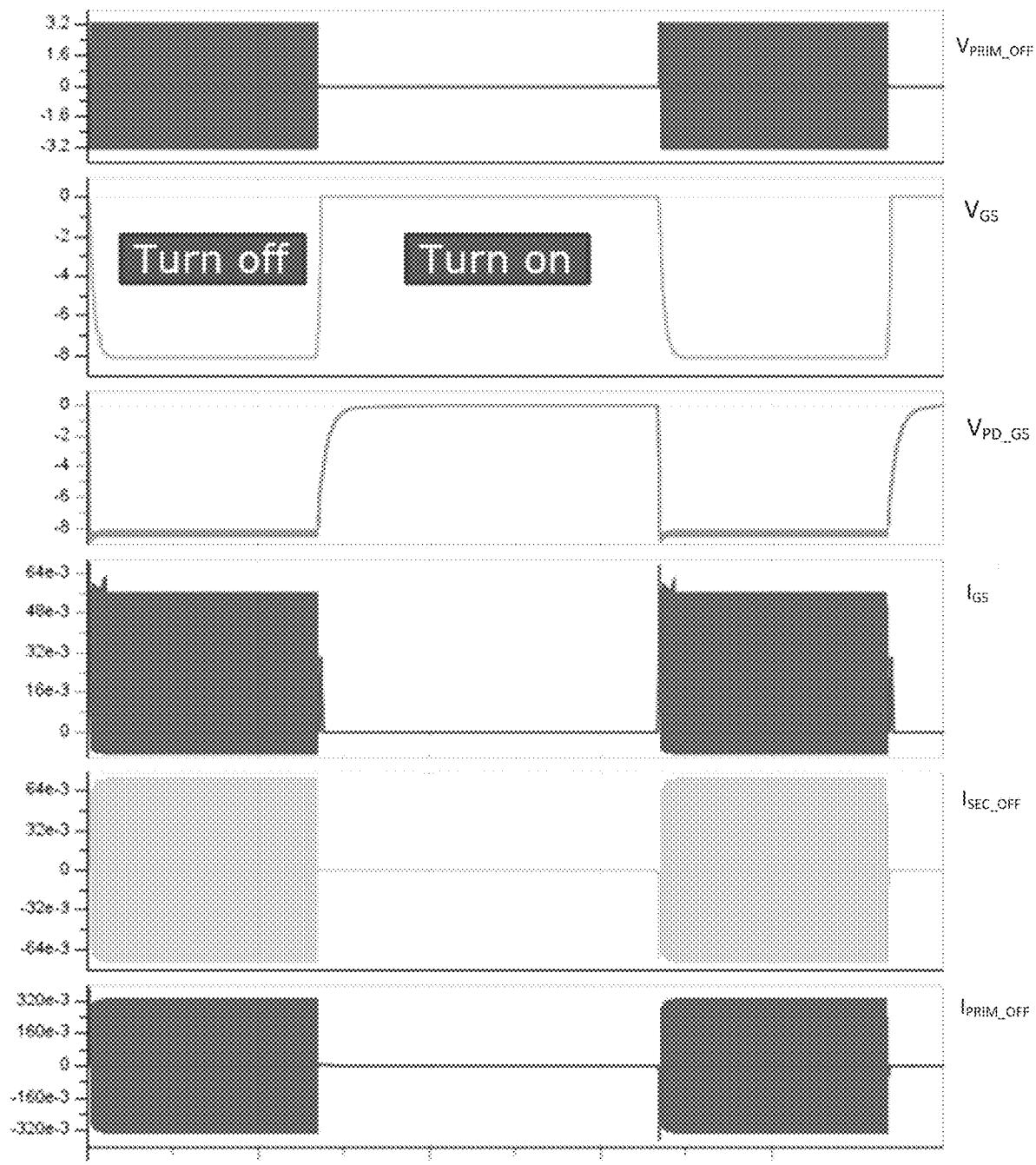
FIG. 26 illustrates voltage and current waveforms corresponding to the circuit of FIG. 25.

FIG. 26 illustrates voltage and current waveforms corresponding to the transformer-driven power switch device 2500 of FIG. 25. During a turn-off interval of the power switch Q1, a primary-side turn-off AC signal $V_{PRIM\_OFF}$ alternates between +3V and −3V. This voltage is stepped up by the transformer 2530 and reduced by the diode drops within the rectifier 2550. The resultant voltage output from the rectifier 2550 is applied across the gate-to-source of the power switch Q1 and the voltage clamp 2562, and has a magnitude of about 16V. The voltage clamp 2562 has a clamp voltage $V_{CL}$=8V when it is forward biased, leading to a pulldown gate-to source voltage $V_{PD\_GS}$ of −8V during the turn-off interval, as shown, which holds the pulldown switch Q2 in its off state. The remaining voltage output from the rectifier 2550 provides the gate-to-source voltage $V_{GS}$ of −8V for the power switch Q1, as shown, which holds the power switch Q1 in its off state. A current $I_{GS}$ flows from the rectifier 2550 during the turn-off intervals. During turn-on intervals, the primary-side turn-off AC signal $V_{PRIM\_OFF}$ is not active, e.g., is not driven or is driven with 0V or some other DC voltage. No appreciable energy is transferred across the transformer 2530, and no current $I_{GS}$ is provided to turn off the power switch Q1. The pulldown gate-to-source voltage $V_{PD\_GS}$ and the power switch gate-to-source voltage $V_{GS}$ rise to 0V, and the power switch Q1 defaults to its normally-on state.

Figure 27:
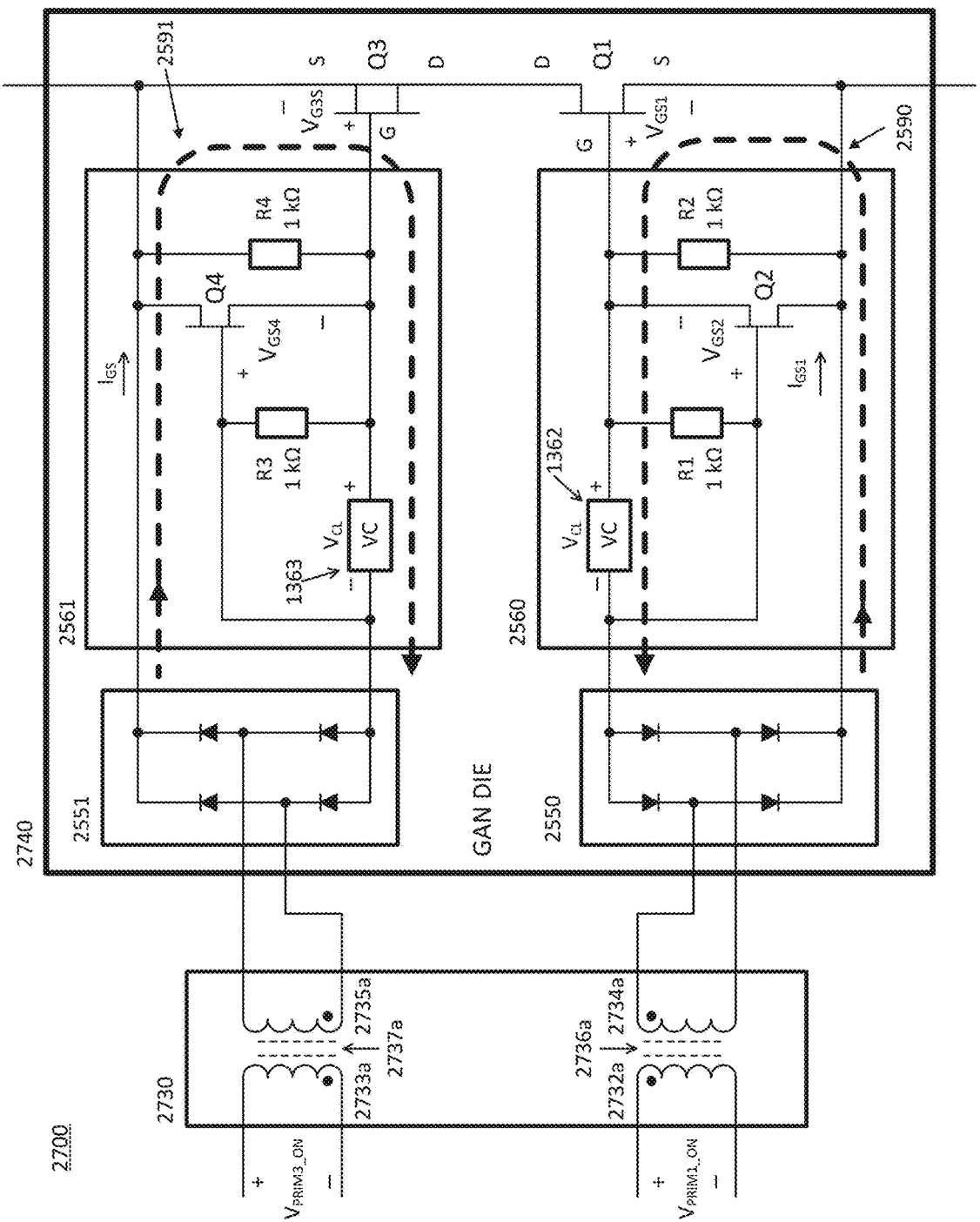
FIG. 27 illustrates a schematic diagram of a circuit topology for a transformer-driven bidirectional switch device that includes normally-on power switches.

FIG. 27 illustrates a transformer-driven switch device 2700 that includes two normally-on power switches Q1, Q3 arranged as a bidirectional switch. The circuitry for driving these switches is similar to the circuitry used in driving the device 2500 of FIG. 25. However, this circuitry is replicated and inverted to drive the power switch Q3, in the same manner as described in FIG. 24 for a bidirectional switch based on normally-off power switches.

Transformer-Based Switch Devices with Non-GaN Power Switches

The previous examples of transformer-based switch devices focus on devices that include GaN transistors as power switches. However, the circuit topologies may be similarly applied to other powers switches, including power MOSFETs. Such MOSFET-based devices preferably have a different partitioning between dies. Notably, the rectification diodes, pulldown switches and/or related driving circuitry may be integrated on the same die as the transformer. As in the previously described devices, either active or passive gate pull down may be used with power MOSFETs. However, the switching speed may be slower than that of conventional MOSFET drivers when using careless transformers. This may be improved via various techniques. For example, stronger current handling coils with reduced coil impedance may lead to faster switch transitions. Cored transformers may be used, which provides improved coupling thereby leading to higher power transfer and faster switch transitions, but may make integration difficult. Use of full-bridge differential driving signals for turn on of power MOSFETs leads to higher power transfer, as compared with single-ended driving signals, and reduces switch transition times. Active pull down of the power MOSFET gate typically provides faster turn-off transitions, and may be necessary to achieve acceptable turn-off transition speed for power MOSFETs in some applications.

Figure 28:
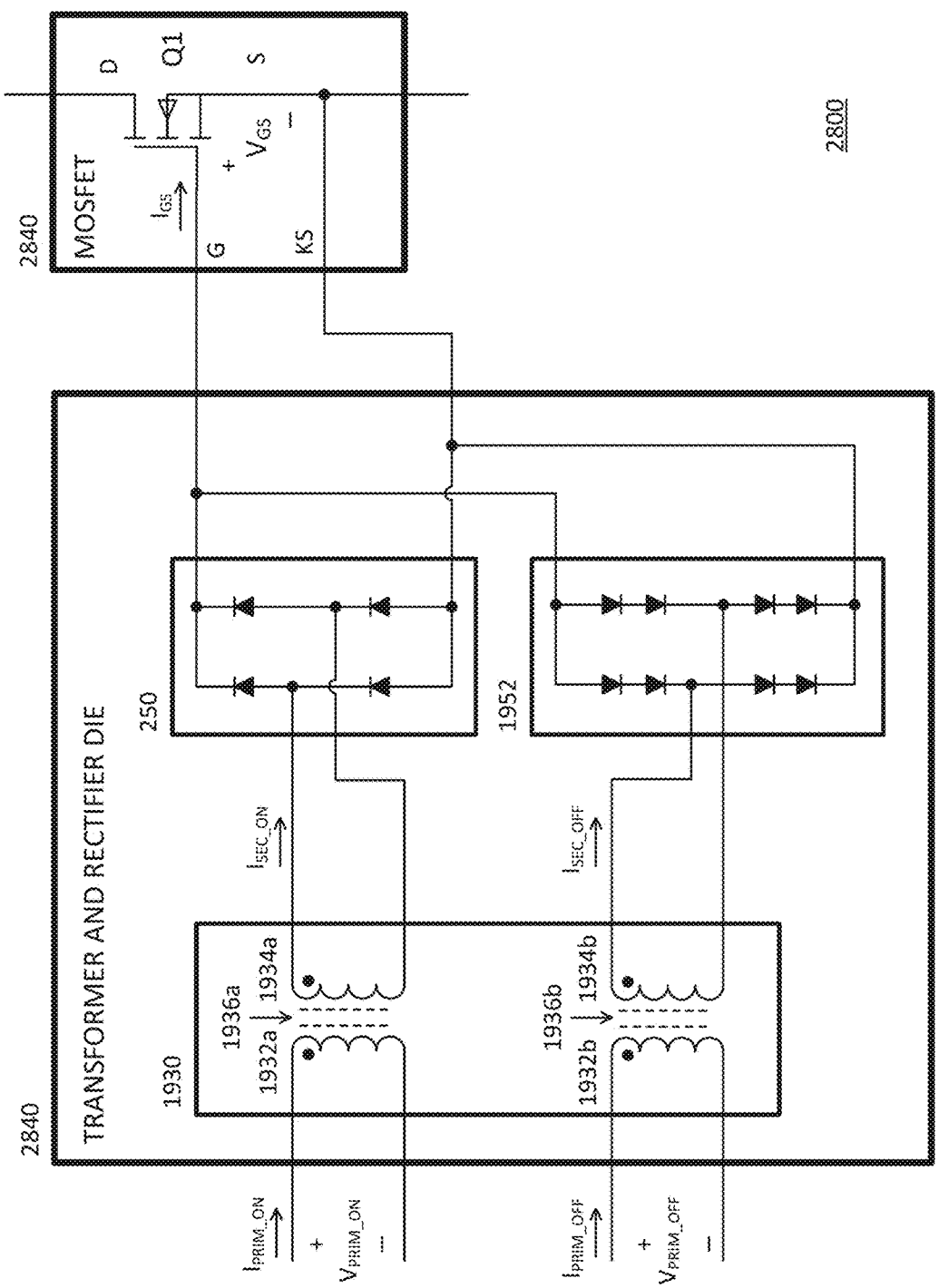
FIG. 28 illustrates a schematic diagram of a circuit topology for a transformer-driven switch device that includes a power MOSFET.

FIG. 28 illustrates a transformer-based switch device 2800 that includes a MOSFET 2840 as the power switch Q1. The illustrated example uses circuitry similar to the circuitry for the device 1900 of FIG. 19. However, this circuitry is physically partitioned differently. The device 2800 includes a transformer and rectifier die 2840. The transformer 1930, turn-on rectifier 250, and turn-off rectifier 1952 are monolithically integrated within this die 2840. The die 2840 may be a silicon die, a silicon carbide die, or made of some other semiconductor material. The power MOSFET 2840 is integrated on a separate die, as illustrated.

Because the transformer 1930, turn-on rectifier 250, and turn-off rectifier 1952 are similar to corresponding components described in relation to FIG. 19, they will not be comprehensively described. Note, however, that the turn-off rectifier 1952 has twice as many diodes as the turn-on rectifier 250. This prevents diodes within the turn-off rectifier 1952 from being forward-biased (activated) during turn-on intervals, during which a positive voltage is driven across the gate and Kelvin source (KS) terminals of the MOSFET 2840. In particular, the turn-off rectifier 1952 should have a high enough threshold voltage such that it is not forward biased for any voltage up to the maximum expected gate-to-source voltage $V_{GS}$ of the MOSFET 2840.

Figure 29:
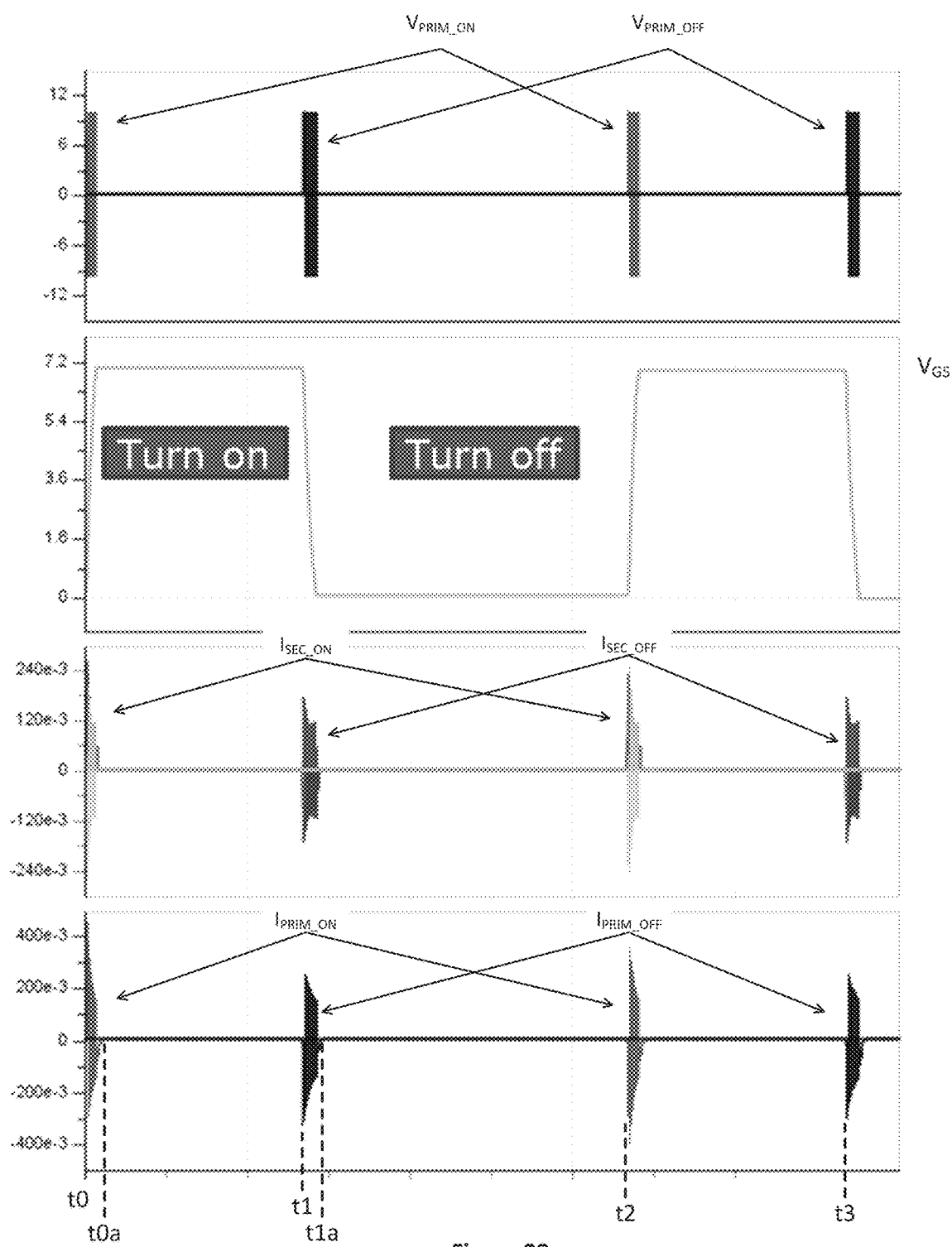
FIG. 29 illustrates voltage and current waveforms corresponding to the circuit of FIG. 28.

Because the gate of a power MOSFET is purely capacitive and does not need to be provided current throughout a turn-on or turn-off interval, the energy transfer periods may be limited to time intervals corresponding to the switch transitions and, thus, turn-on and turn-off drive signals may be discontinuous, as shown in FIG. 29.

FIG. 29 illustrates voltage and current waveforms corresponding to the transformer-based switch device 2800 of FIG. 28. Starting at time t0, a turn-on signal $V_{PRIM\_ON}$ is activated such that it alternates between +10V and −10V until time t0a. Primary and secondary-side currents $I_{PRIM\_ON}$ and $I_{SEC\_ON}$ are supplied during this interval and, after rectification by the turn-on rectifier 250, provide a positive current $I_{GS}$ to the gate of the MOSFET 2840. Once the gate-to-source voltage $V_{GS}$ reaches a turn-on threshold, e.g., 5V, for the power MOSFET 2840, the power MOSFET 2840 is turned on. After the power MOSFET 2840 is turned on, the turn-on signal $V_{PRIM\_ON}$ may be deactivated, e.g., set to 0V or some other DC voltage.

For the turn-off transition at time t1, a turn-off signal $V_{PRIM\_OFF}$ is activated such that it alternates between +10V and −10V until time t1a. Primary and secondary-side currents $I_{PRIM\_OFF}$ and $I_{SEC\_OFF}$ are supplied during this interval and, after rectification by the turn-on rectifier 250, sinks current from the gate of the MOSFET 2840, i.e., provides a negative current $I_{GS}$. This sunk current discharges the MOSFET gate (G) and reduces the gate-to-source voltage $V_{GS}$ so as to turn off the power MOSFET 2840. After the power MOSFET 2840 is turned off, the turn-off signal $V_{PRIM\_OFF}$ may be deactivated, e.g., set to 0V or some other DC voltage. The turn-on and turn-off transition speeds depend, in part, on the gate-to-source capacitance of the MOSFET 2840, which is 2 nF for the illustrated embodiment.

The circuit topologies described in relation to the transformer-based switch devices using GaN power switches may be similarly modified to use MOSFET power switches, in the same manner as shown in FIG. 28.

Switch Transition Speeds

The transformer-driven switch devices described herein provide considerable flexibility regarding switch transition speeds, which may provide advantages compared to conventional power switch drive techniques. For the devices employing active turn on based on a turn-on signal, e.g., $V_{PRIM\_ON}$, the turn-on transition speed may be dynamically controlled by altering the voltage and/or current provided by the turn-on signal. Alternatively, the turn-on transition speed may be slowed by skipping pulses within the turn-on signal, which may be simpler in that this only requires alteration of the digital control in the signal generator, as opposed to altering an analog power signal. Similarly, a duty cycle or frequency of the turn-on signal may be altered so as to control the turn-on transition speed. Devices employing active turn off based on a turn-off signal, e.g., $V_{PRIM\_OFF}$, may similarly alter their turn-off transition speed by altering the voltage and/or current of the turn-off signal, and/or by skipping pulses or altering the duty cycle or frequency of the turn-off signal. For power switches, such as GaN, that ideally have a high driven current when being transitioned on, but may subsequently be maintained with a lower current, pulse skipping may be employed to achieve the lower maintenance current.

Although the present disclosure is not so limited, the following numbered examples demonstrate one or more aspects of the disclosure.

Example 1. A transformer-driven switch device includes a power transistor, a first transformer, and a first rectifier. The power transistor has first and second load terminals, and a control terminal that controls conductivity between the first and second load terminals. The first transformer comprises a first primary winding and a first secondary winding. The first rectifier is coupled between the first secondary winding and the control terminal of the power transistor. The first secondary winding and the first rectifier are configured to transfer requisite energy and control timing for driving the control terminal, so as to control conductivity between the first and second load terminals, based upon an input waveform coupled to the first primary winding. The input waveform includes a turn-on interval having a plurality of high-frequency pulses that the first transformer and the first rectifier convert to a single turn-on control pulse that is provided to the control terminal for turning on the power transistor, and includes a direct-current (DC) level during a turn-off interval of the power transistor.

Example 2. The transformer-driven switch device of example 1, wherein the power transistor, the first transformer, and the first rectifier are integrated within a same package.

Example 3. The transformer-driven switch device of example 1, wherein the first transformer is a cureless transformer having no magnetic core.

Example 4. The transformer-driven switch device of example 3, wherein the first transformer is integrated in a silicon die.

Example 5. The transformer-driven switch device of example 4, wherein the first rectifier is integrated in the same silicon die as the first transformer.

Example 6. The transformer-driven switch device of example 1, wherein a frequency of the high-frequency pulses is varied during the turn-on interval so as to control the turn-on speed of the power transistor.

Example 7. The transformer-driven switch device of example 1, wherein the power transistor is a normally-off High-Electron Mobility Transistor (HEMT), the first load terminal is a drain, the second load terminal is a source, and the control terminal is a gate.

Example 8. The transformer-driven switch device of example 7, wherein the normally-off HEMT is a Gallium nitride (GaN) based gate injection transistor.

Example 9. The transformer-driven switch device of example 7, further comprising a pulldown transistor configured to short the gate to the source during the turn-off interval of the power transistor.

Example 10. The transformer-driven switch device of example 9, wherein the pulldown transistor is a normally-on HEMT comprising a pulldown drain, a pulldown source, and a pulldown gate. The transformer-driven switch device further comprises a pulldown control circuit connected between the pulldown gate and the pulldown source, and configured to autonomously apply a pulldown turn-off voltage, which is negative, to the pulldown gate, relative to the pulldown source, when the power transistor is turned on, and to autonomously discharge the pulldown turn-off voltage during the turn-off interval of the power transistor.

Example 11. The transformer-driven switch device of example 10, wherein the pulldown control circuit comprises a voltage clamp and a resistor. The voltage clamp is coupled between the pulldown source and the pulldown gate, and configured to apply the pulldown turn-off voltage to the pulldown gate relative to the pulldown source when the power transistor is turned on. The resistor is coupled between the pulldown gate and the pulldown source, and is configured to provide the autonomous discharge of the pulldown turn-off voltage when the power transistor is turned off.

Example 12. The transformer-driven switch device of example 11, wherein the voltage clamp comprises one or more HEMTs configured as diodes, the resistor comprises a two-dimensional electron gas (2DEG) HEMT region, the first rectifier comprises one or more HEMTs configured as diodes. The first rectifier, the pulldown transistor, and the pulldown control circuit are monolithically integrated on a same die as the normally-off HEMT.

Example 13. The transformer-driven switch device of example 9, further comprising a second transformer that comprises a second primary winding and a second secondary winding. The pulldown transistor is a normally-off HEMI comprising a pulldown source, a pulldown drain, and a pulldown gate. The transformer-driven switch device further comprises a second rectifier that is coupled between the second secondary winding and the pulldown gate. The second rectifier is configured to convert a plurality of high-frequency pulses received from the second secondary winding into a single turn-on pulse that is applied to the pulldown gate.

Example 14. The transformer-driven switch device of example 13, wherein the pulldown drain is coupled to the gate of the power transistor, the pulldown gate is coupled to the source of the power transistor, and the second rectifier is coupled across the pulldown gate and the pulldown source.

Example 15. The transformer-driven switch device of example 14, wherein a frequency and/or an amplitude of a high-frequency turn-off waveform applied to the second primary winding controls a turn-on speed of the pulldown transistor and a turn-off speed of the power transistor.

Example 16. The transformer-driven switch device of example 13, wherein the first rectifier, the second rectifier, and the pulldown transistor are monolithically integrated on a same die as the power transistor.

Example 17. The transformer-driven switch device of example 7, further comprising a second transformer and a second rectifier. The second transformer includes a second primary winding and a second secondary winding. The second rectifier is coupled to the second secondary winding and is coupled across the gate and the source of the power transistor, such that a negative turn-off voltage is provided between the gate and the source responsive to reception of an alternating current (AC) signal from the second secondary winding.

Example 18. The transformer-driven switch device of example 17, wherein the first rectifier and the second rectifier are monolithically integrated in the same die as the power transistor.

Example 19. A transformer-driven power switch system that includes a power transistor, a first transformer, a rectifier, and a control logic circuit. The power transistor comprises a first load terminal, a second load terminal, and a control terminal that controls conductivity between the first and second load terminals. The first transformer includes a first primary winding and a first secondary winding. The rectifier is coupled between the transformer and the control terminal. The control logic circuit comprises a control input and a frequency generator, wherein the frequency generator is configured to provide a turn-on high-frequency signal to the first primary winding responsive to the control input receiving a turn-on level, and to provide a direct-current (DC) signal to the first primary winding responsive to the control input receiving a turn-off level.

Example 20. The transformer-driven power switch system of example 19, wherein the control logic circuit and the first transformer are monolithically integrated in a same silicon die.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transformer-driven switch device, comprising:
    a power transistor comprising a first load terminal, a second load terminal, and a control terminal that controls conductivity between the first and second load terminals;
    a first transformer comprising a first primary winding and a first secondary winding; and
    a first rectifier coupled between the first secondary winding and the control terminal,
    wherein the first secondary winding and the first rectifier are configured to transfer requisite energy and control timing for driving the control terminal, so as to control conductivity between the first and second load terminals, based upon an input waveform coupled to the first primary winding, the input waveform comprising a turn-on interval having a plurality of high-frequency pulses that the first transformer and the first rectifier convert to a single turn-on control pulse that is provided to the control terminal for turning on the power transistor, and comprising a direct-current (DC) voltage level during a turn-off interval of the power transistor.

2. The transformer-driven switch device of claim 1, wherein the power transistor, the first transformer, and the first rectifier are integrated within a same package.

3. The transformer-driven switch device of claim 1, wherein the first transformer is a coreless transformer having no magnetic core.

4. The transformer-driven switch device of claim 3, wherein the first transformer is integrated in a silicon die.

5. The transformer-driven switch device of claim 4, wherein the first rectifier is integrated in the same silicon die as the first transformer.

6. The transformer-driven switch device of claim 1, wherein a frequency of the high-frequency pulses is varied during the turn-on interval so as to control the turn-on speed of the power transistor.

7. The transformer-driven switch device of claim 1, wherein the power transistor is a normally-off High-Electron Mobility Transistor (HEMT), the first load terminal is a drain, the second load terminal is a source, and the control terminal is a gate.

8. The transformer-driven switch device of claim 7, wherein the normally-off HEMT is a Gallium Nitride (GaN) based gate injection transistor.

9. The transformer-driven switch device of claim 7, further comprising a pulldown transistor configured to short the gate to the source during the turn-off interval of the power transistor.

10. The transformer-driven switch device of claim 9, wherein the pulldown transistor is a normally-on HEMT comprising a pulldown drain, a pulldown source, and a pulldown gate, the transformer-driven switch device further comprising:
    a pulldown control circuit connected between the pulldown gate and the pulldown source, and configured to autonomously apply a pulldown turn-off voltage, which is negative, to the pulldown gate, relative to the pulldown source, when the power transistor is turned on, and to autonomously discharge the pulldown turn-off voltage during the turn-off interval of the power transistor.

11. The transformer-driven switch device of claim 10, wherein the pulldown control circuit comprises:
    a voltage clamp coupled between the pulldown source and the pulldown gate, and configured to apply the pulldown turn-off voltage to the pulldown gate relative to the pulldown source when the power transistor is turned on; and
    a resistor coupled between the pulldown gate and the pulldown source, and configured to provide the autonomous discharge of the pulldown turn-off voltage when the power transistor is turned off.

12. The transformer-driven switch device of claim 11, wherein the voltage clamp comprises one or more HEMTs configured as diodes, the resistor comprises a two-dimensional electron gas (2DEG) region, the first rectifier comprises one or more HEMTs configured as diodes, and the first rectifier, the pulldown transistor, and the pulldown control circuit are monolithically integrated on a same die as the normally-off HEMT.

13. The transformer-driven switch device of claim 9, further comprising a second transformer that comprises a second primary winding and a second secondary winding,
    wherein the pulldown transistor is a normally-off HEMT comprising a pulldown source, a pulldown drain, and a pulldown gate, wherein the transformer-driven switch device further comprises a second rectifier that is coupled between the second secondary winding and the pulldown gate, and wherein the second rectifier is configured to convert a plurality of high-frequency pulses received from the second secondary winding into a single pulldown turn-on pulse that is applied to the pulldown gate.

14. The transformer-driven switch device of claim 13, wherein the pulldown drain is coupled to the gate of the power transistor, the pulldown gate is coupled to the source of the power transistor, and the second rectifier is coupled across the pulldown gate and the pulldown source.

15. The transformer-driven switch device of claim 14, wherein a frequency and/or an amplitude of a high-frequency turn-off waveform applied to the second primary winding controls a turn-on speed of the pulldown transistor and a turn-off speed of the power transistor.

16. The transformer-driven switch device of claim 13, wherein the first rectifier, the second rectifier, and the pulldown transistor are monolithically integrated in a same die as the power transistor.

17. The transformer-driven switch device of claim 7, further comprising:
 a second transformer that comprises a second primary winding and a second secondary winding; and
 a second rectifier coupled to the second secondary winding and coupled across the gate and the source of the power transistor, such that a negative turn-off voltage is provided between the gate and the source responsive to reception of an alternating current (AC) signal from the second secondary winding.

18. The transformer-driven switch device of claim 17, wherein the first rectifier and the second rectifier are monolithically integrated in the same die as the power transistor.

19. A transformer-driven power switch system, comprising:
 a power transistor comprising a first load terminal, a second load terminal, and a control terminal that controls conductivity between the first and second load terminals;
 a first transformer comprising a first primary winding and a first secondary winding;
 a rectifier coupled between the transformer and the control terminal; and
 a control logic circuit comprising a control input and a frequency generator, wherein the frequency generator is configured to provide a turn-on high-frequency signal to the first primary winding responsive to the control input receiving a turn-on level, and to provide a direct-current (DC) signal to the first primary winding responsive to the control input receiving a turn-off level.

20. The transformer-driven power switch system of claim 19, wherein the control logic circuit and the first transformer are monolithically integrated in a same silicon die.

\* \* \* \* \*

UNITED STATES PATENT AND TRADEMARK OFFICE
CERTIFICATE OF CORRECTION

PATENT NO. : 10,958,268 B1
APPLICATION NO. : 16/560145
DATED : March 23, 2021
INVENTOR(S) : K. Leong et al.

Page 1 of 1

It is certified that error appears in the above-identified patent and that said Letters Patent is hereby corrected as shown below:

On the Title Page

Column 2, Abstract, Line 6, please change "careless" to --coreless--

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*